United States Patent
Zhang

(10) Patent No.: US 8,336,148 B2
(45) Date of Patent: Dec. 25, 2012

(54) SYSTEM AND METHOD FOR CLEANING A CHARGING WAFER SURFACE

(75) Inventor: John H. Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 119 days.

(21) Appl. No.: 12/803,974

(22) Filed: Jul. 12, 2010

(65) Prior Publication Data
US 2012/0009693 A1    Jan. 12, 2012

(51) Int. Cl.
*B08B 7/00* (2006.01)

(52) U.S. Cl. ............... 15/88.3; 15/88.2; 15/77; 15/102

(58) Field of Classification Search ............... 15/88.3, 15/88.2, 88.4, 77, 102
See application file for complete search history.

(56) References Cited

U.S. PATENT DOCUMENTS

| 6,393,334 | B1 * | 5/2002 | Lewis et al. | 700/117 |
| 7,468,105 | B2 * | 12/2008 | Andreas | 134/2 |
| 8,010,221 | B2 * | 8/2011 | Hontake et al. | 700/121 |

* cited by examiner

*Primary Examiner* — Shay Karls
(74) *Attorney, Agent, or Firm* — Munck Wilson Mandala, LLP

(57) ABSTRACT

A system and method for processing a wafer includes a charge neutralization system. The wafer processing system includes a wafer measuring device that can measure characteristics of a surface of the semiconductor wafer. One or more wafer processing stations perform a chemical mechanical polish (CMP) process on the wafer surface. A desica cleaning station can clean and dry the semiconductor wafer. The wafer processing system further includes a charge neutralizing device that can alter a surface charge of the wafer surface.

20 Claims, 21 Drawing Sheets

SYSTEM AND METHOD FOR CLEANING A CHARGING WAFER SURFACE

TECHNICAL FIELD

The disclosure relates generally to semiconductor substrates and more particularly to a system and method for cleaning a charging wafer surface.

BACKGROUND

Chemical Mechanical Polishing (CMP) is wet process used in semiconductor manufacturing processes. CMP is a process that uses an abrasive and corrosive chemical slurry in conjunction with a polishing pad and retaining ring.

Wafer charging is a well known production yield detractor. Wafer charging can cause a circuit shortage and induce defects. For example, recently it has been found that, for 32 nm Mx levels, an increasing trend of dendrite defects is present.

SUMMARY

Embodiments of the present disclosure provide a wafer processing system capable of cleaning a surface of a semiconductor wafer. The wafer processing system includes a wafer measuring device that can measure characteristics of a surface of the semiconductor wafer. The wafer processing system also includes at least one wafer processing station configured to clean and/or polish the wafer surface. In addition, the wafer processing system includes a charge neutralizing device that can alter a surface charge of the wafer surface.

Embodiments of the present disclosure also provide a Chemical Mechanical Planarization (CMP) system capable of cleaning a surface of a semiconductor wafer. The CMP system includes a wafer measuring device that can measure characteristics of a surface of the semiconductor wafer. The CMP also includes at least one wafer processing station that can perform a CMP process on the wafer surface and a desica cleaning station that can clean and dry the semiconductor wafer. The CMP system further includes a charge neutralizing device that can alter a surface charge of the wafer surface.

Now Embodiments of the present disclosure provide a method for cleaning a surface of a semiconductor wafer. The method includes measuring at least one characteristic of a surface of the semiconductor wafer. The method also includes processing the wafer surface and neutralizing a surface charge of the wafer surface.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Figure 1A:
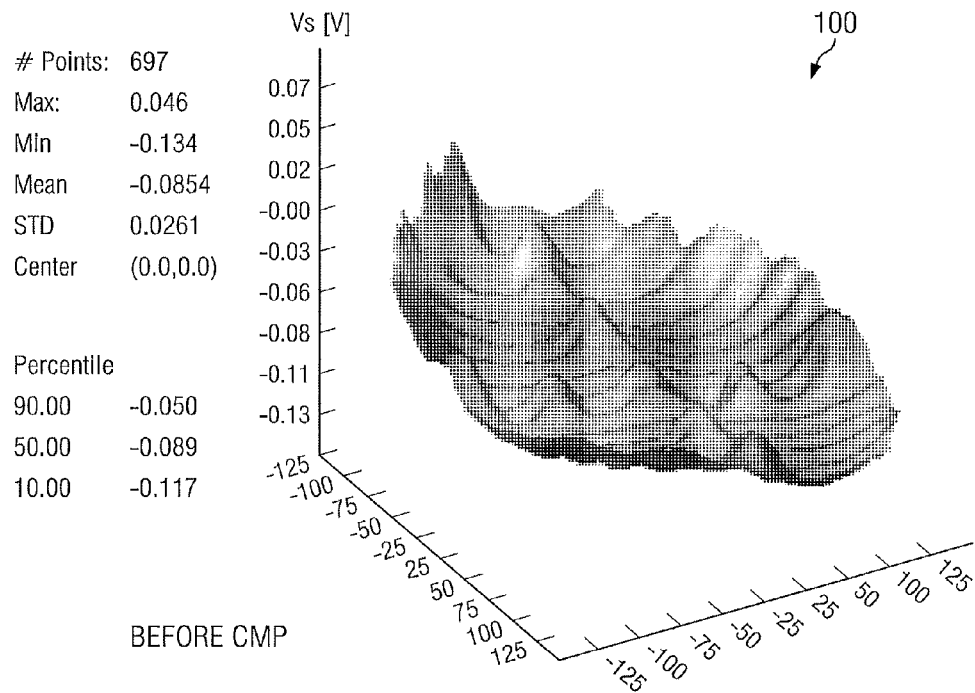
FIGS. 1A through 1P illustrate surface charges before and after CMP according to this disclosure.
Figure 1A:
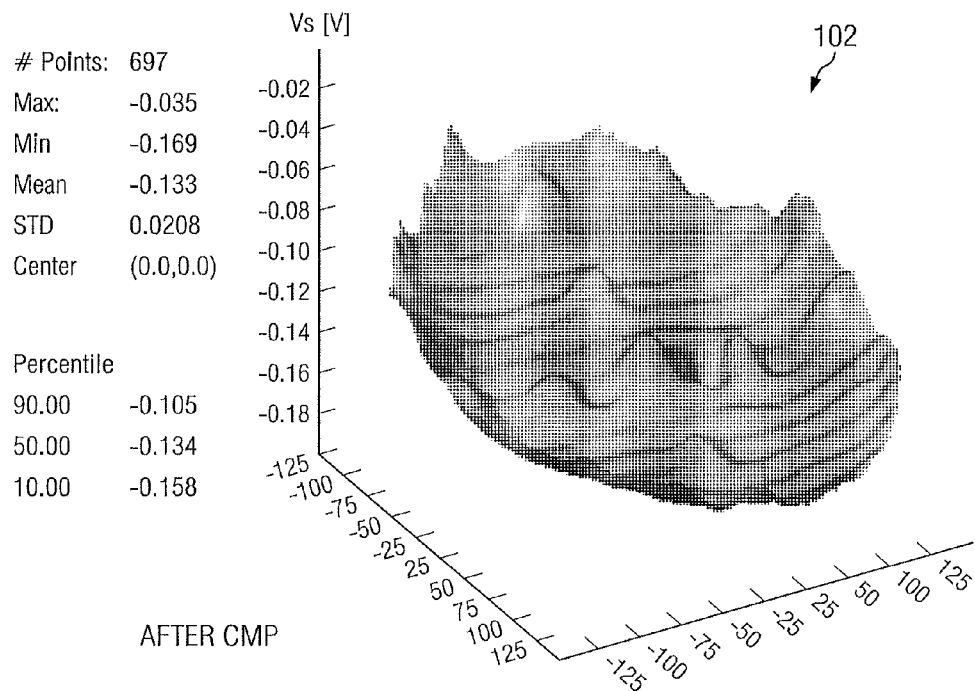
Figure 1B:
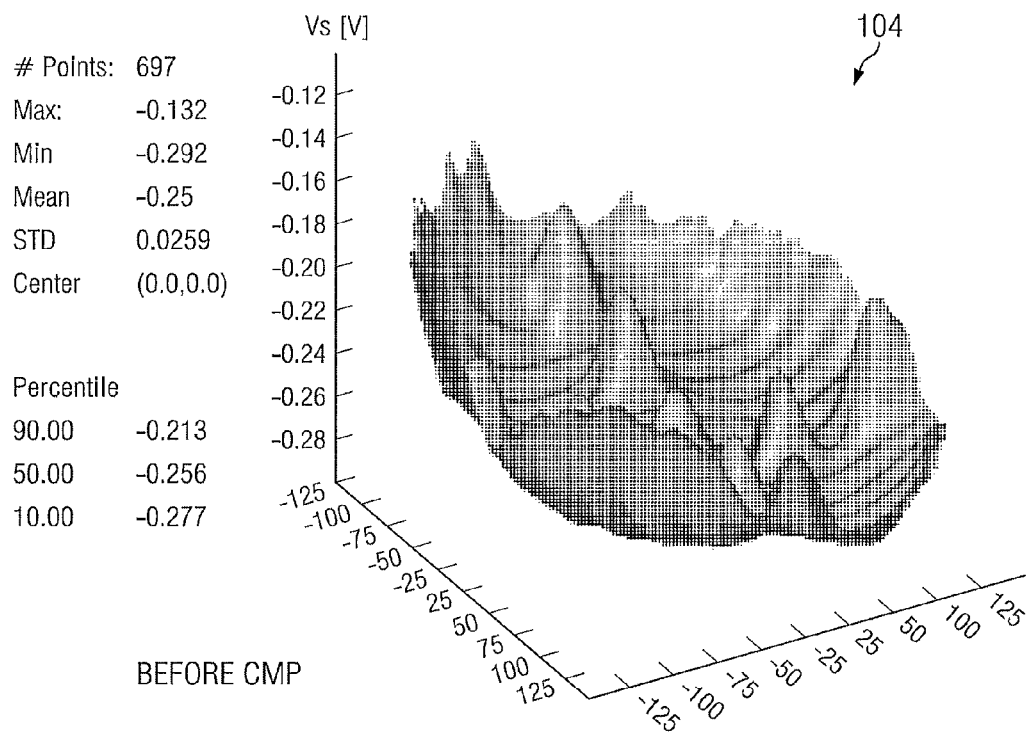
Figure 1B:
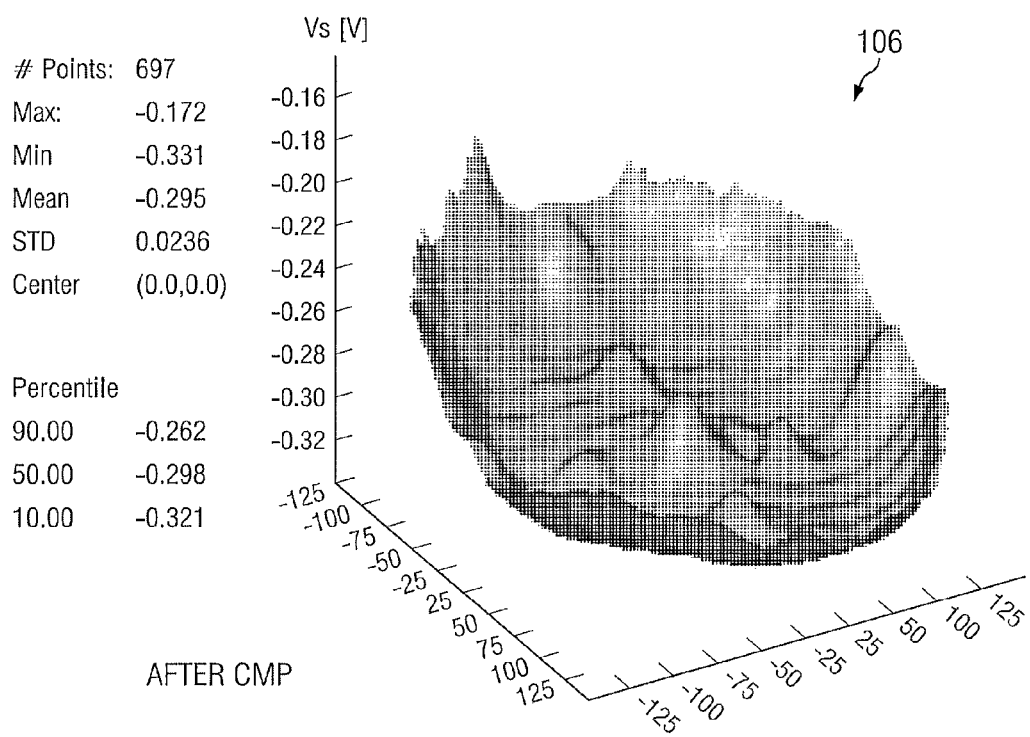
Figure 1C:
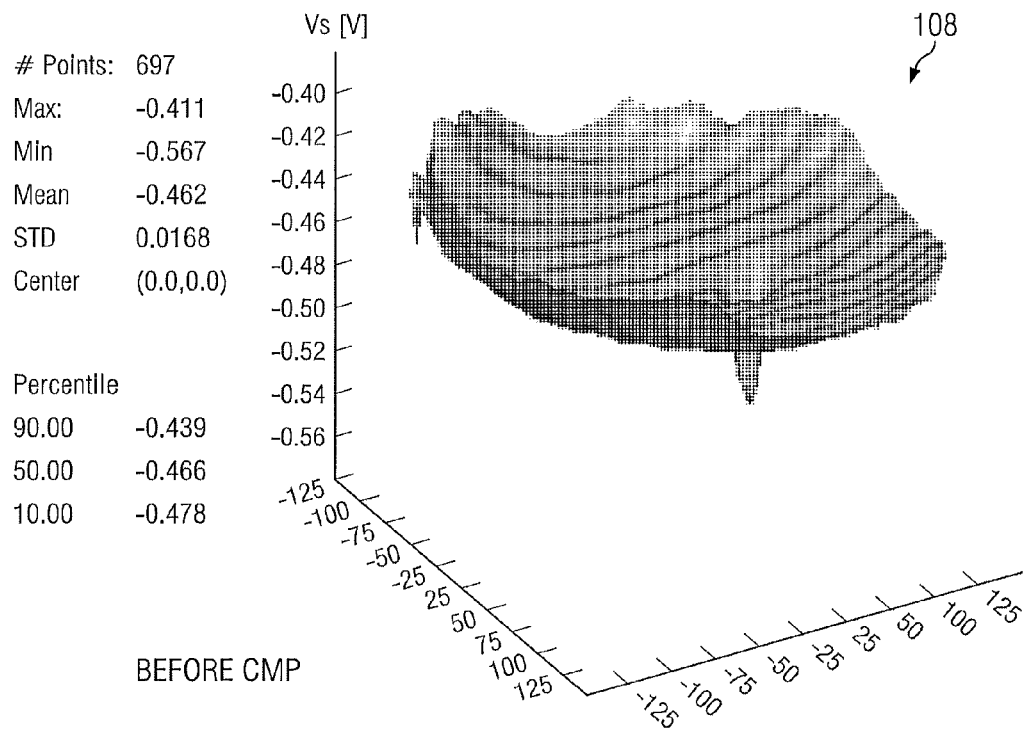
Figure 1C:
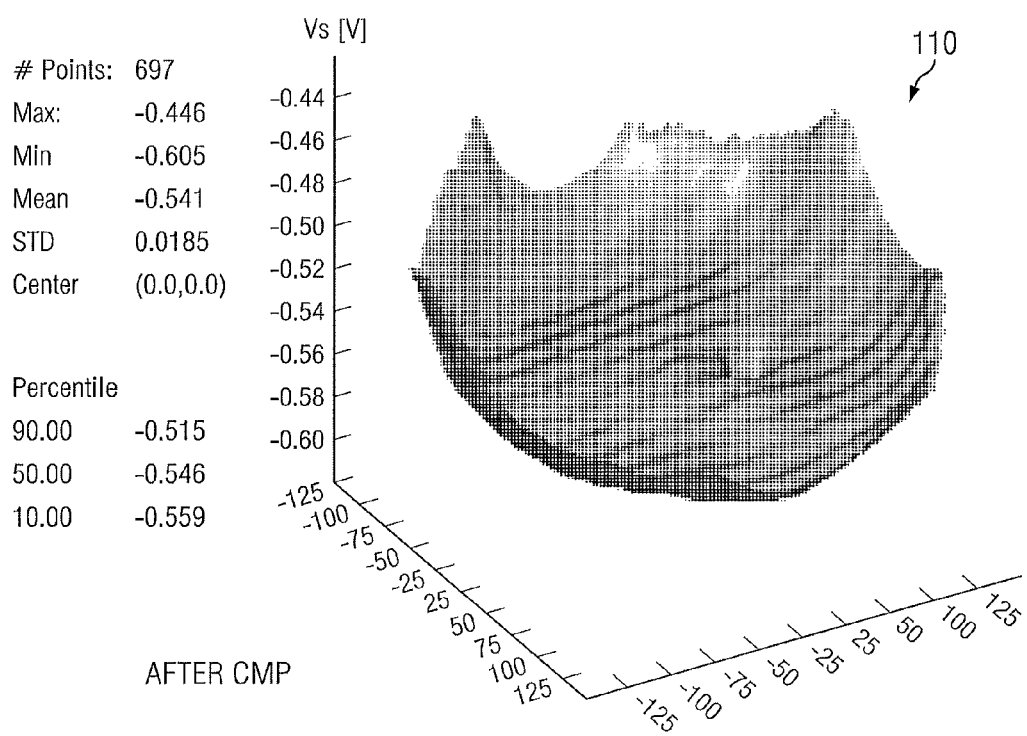
Figure 1D:
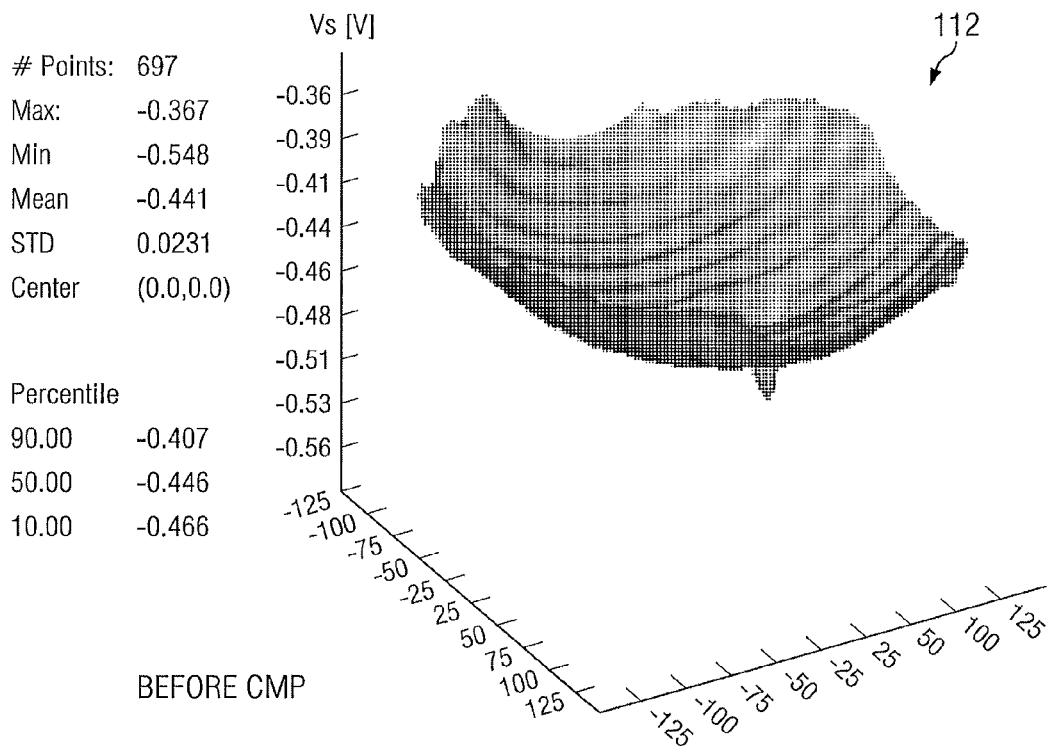
Figure 1D:
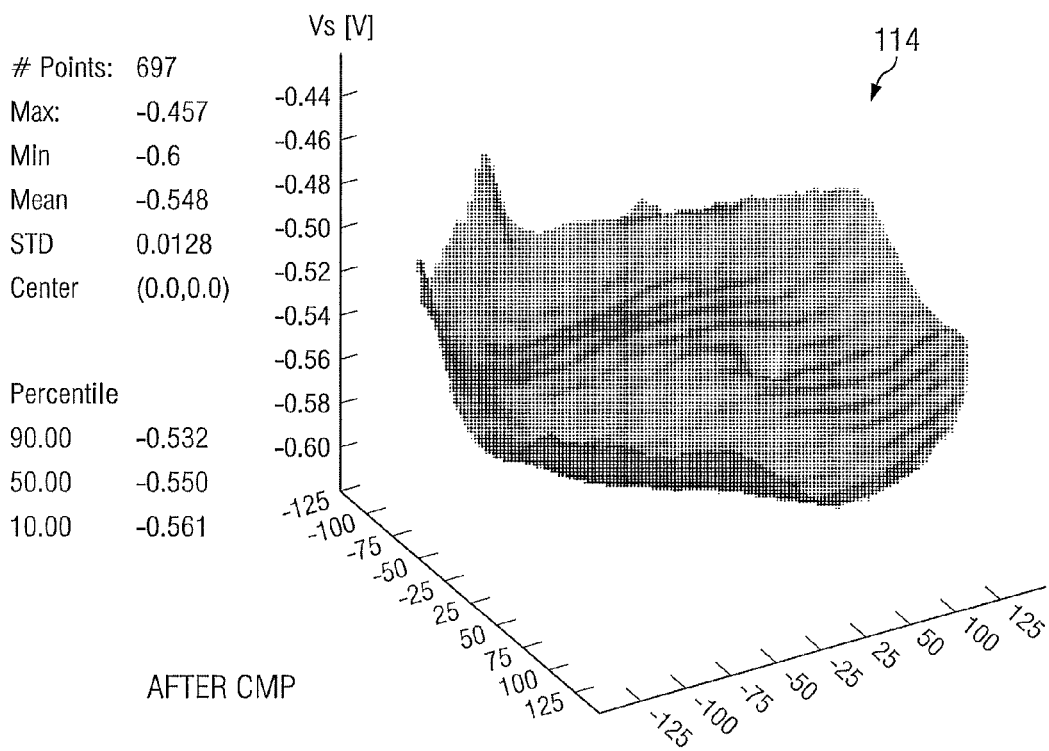
Figure 1E:
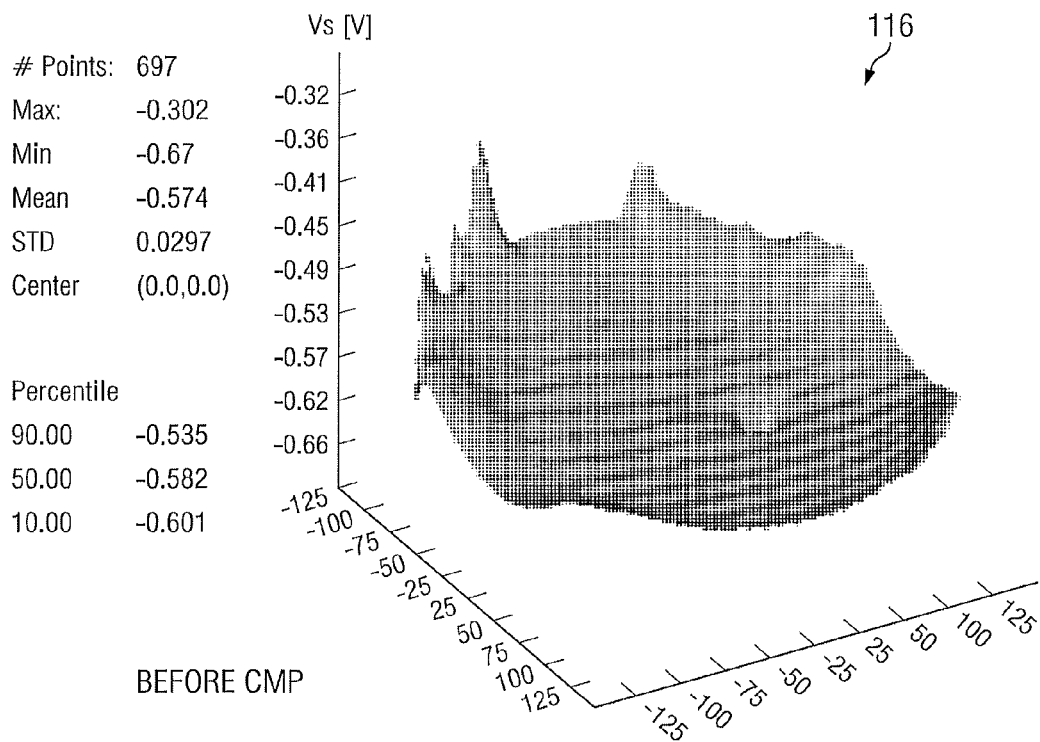
Figure 1E:
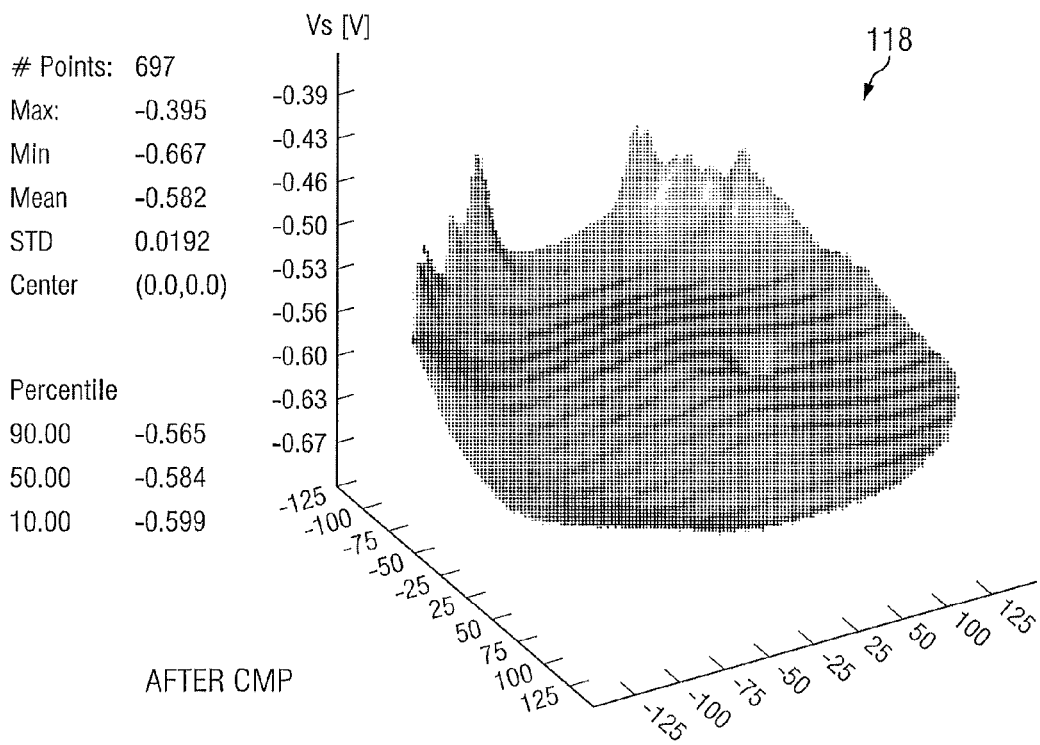
Figure 1F:
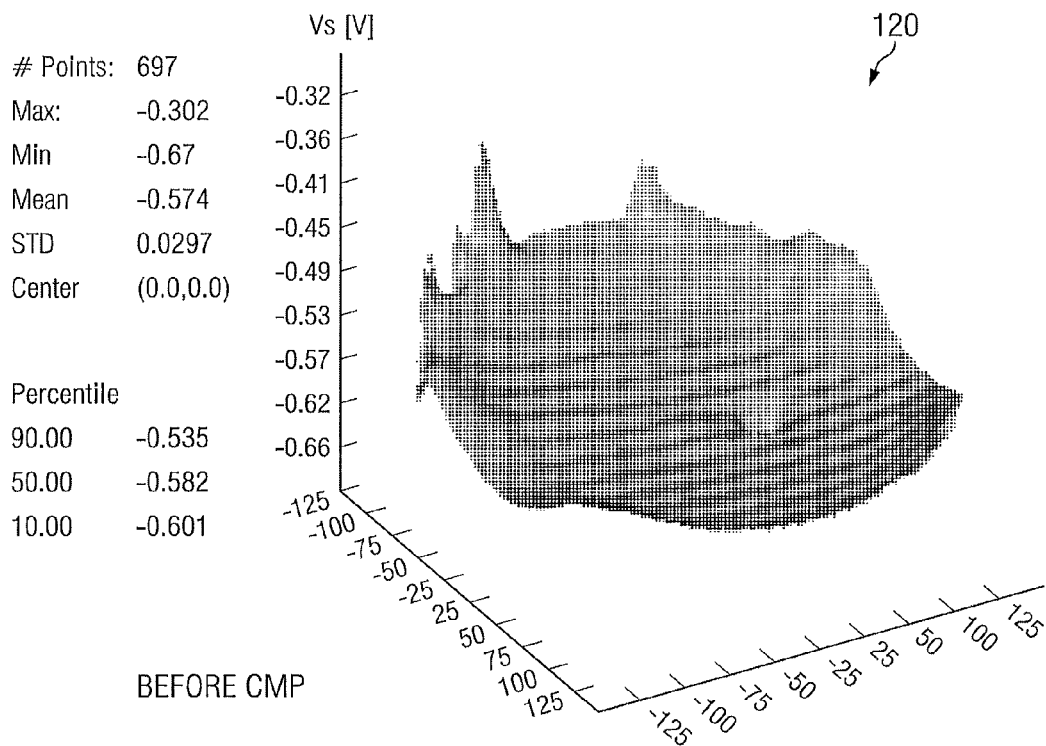
Figure 1F:
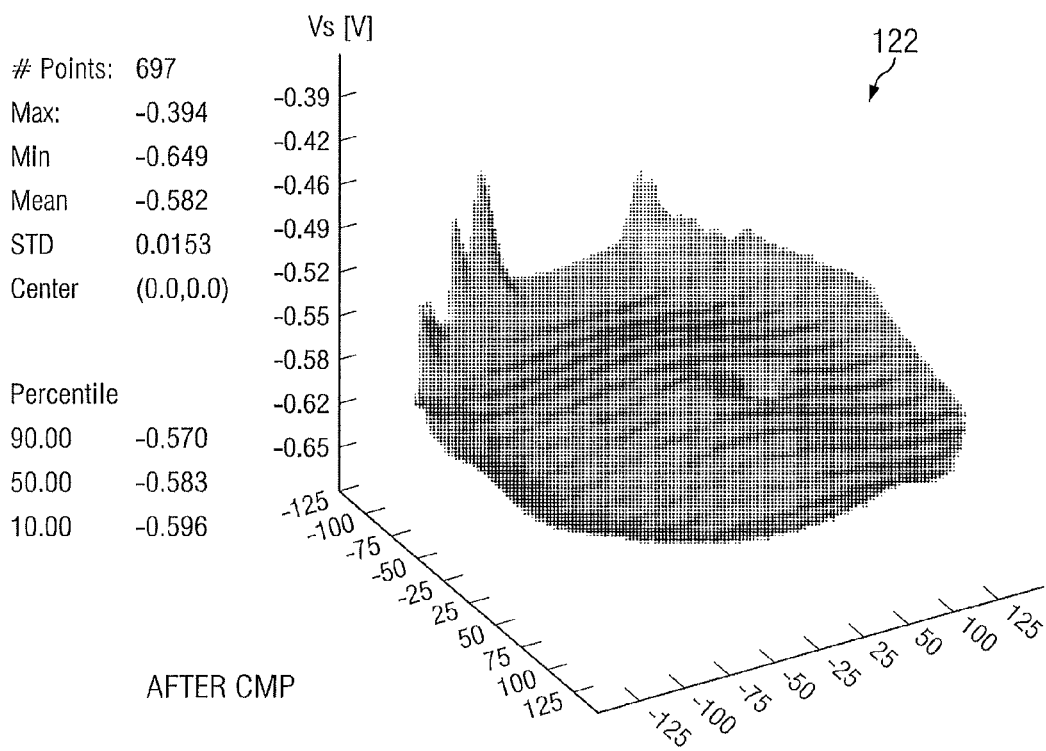
Figure 1G:
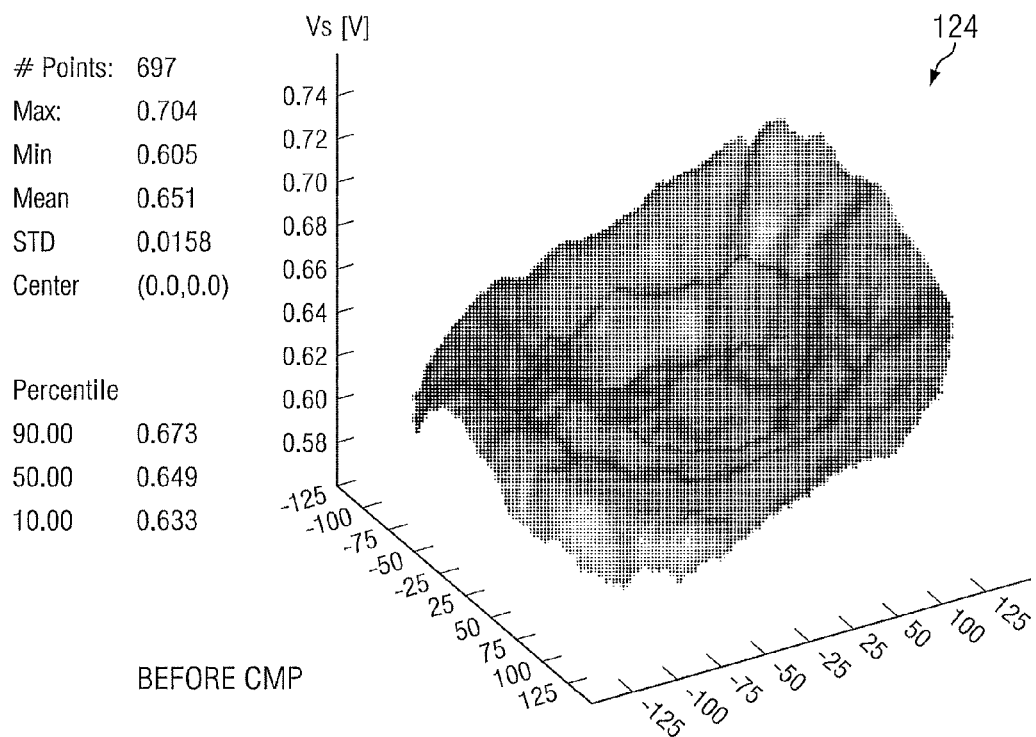
Figure 1G:
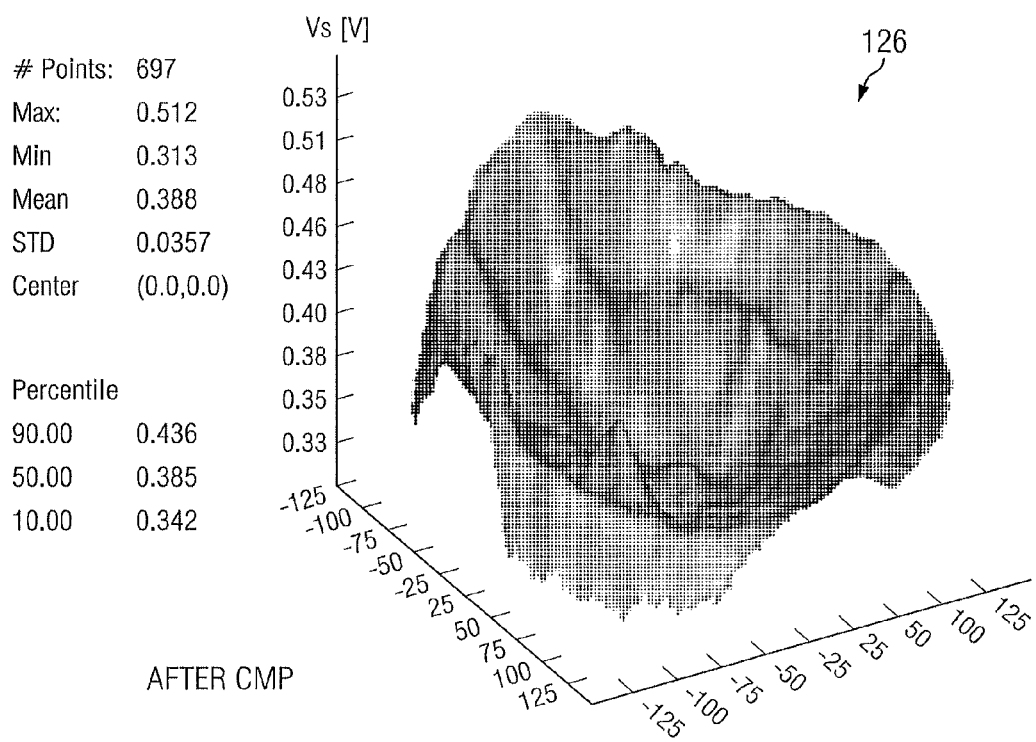
Figure 1H:
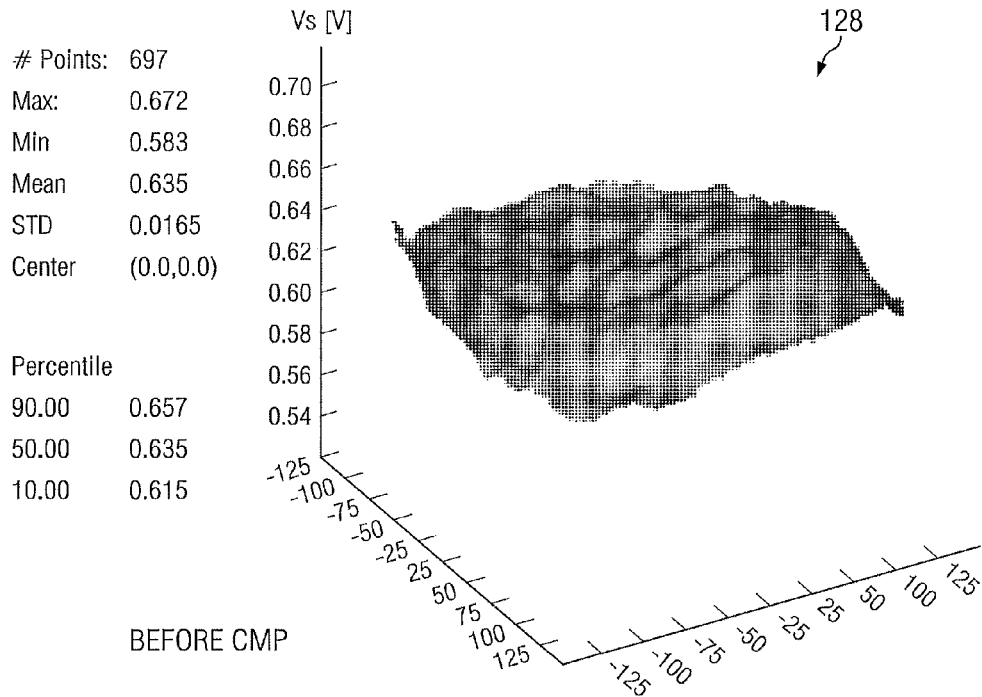
Figure 1H:
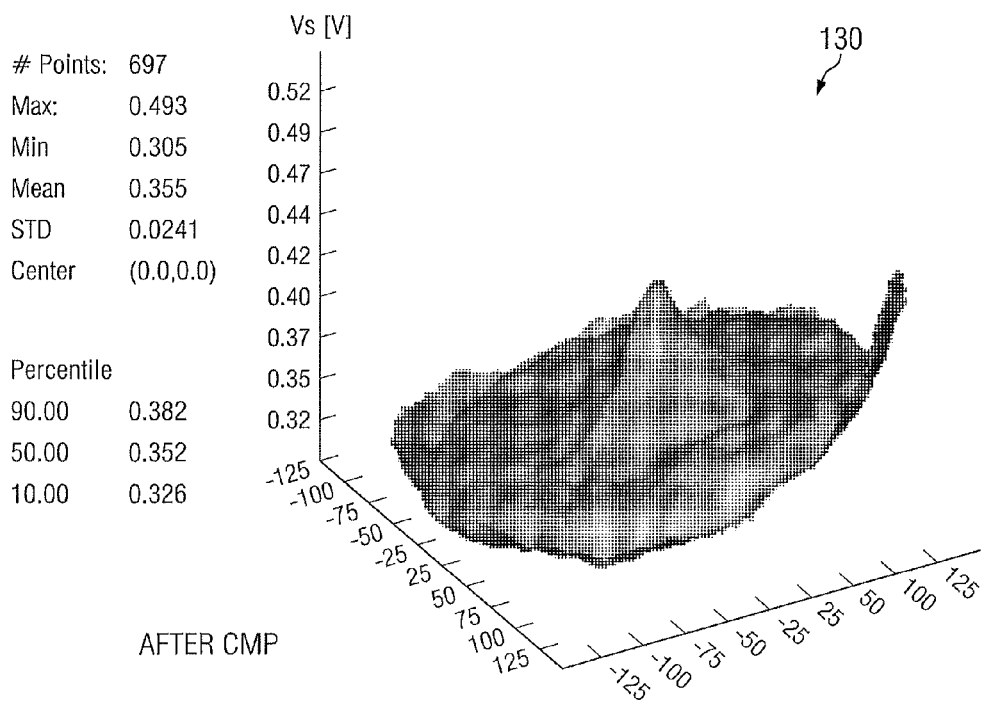
Figure 11:
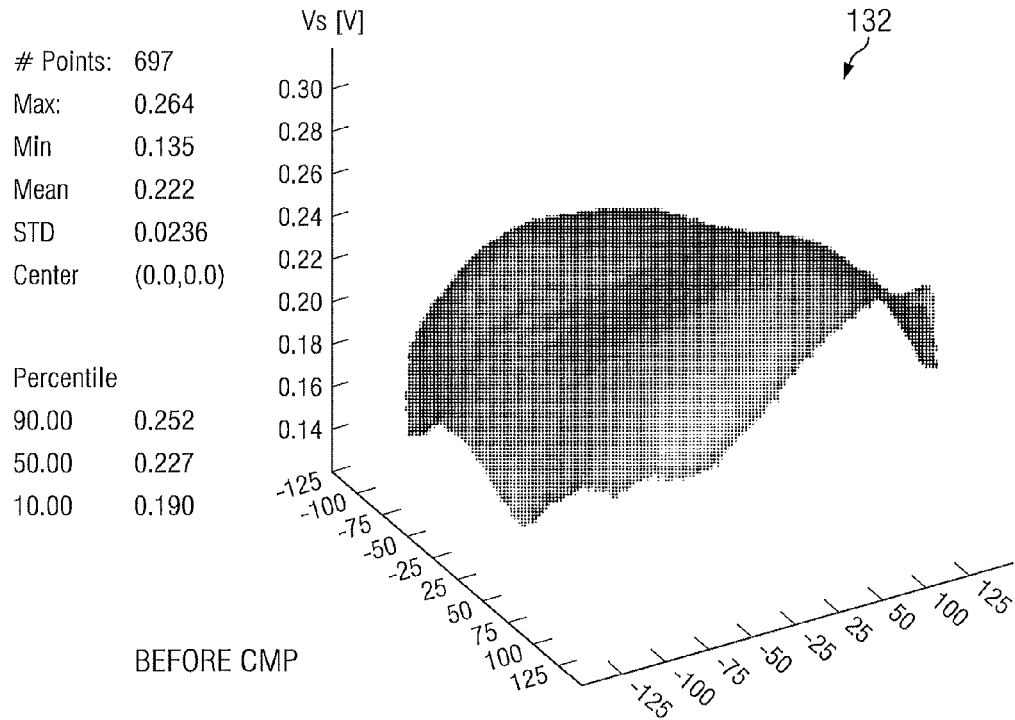
Figure 11:
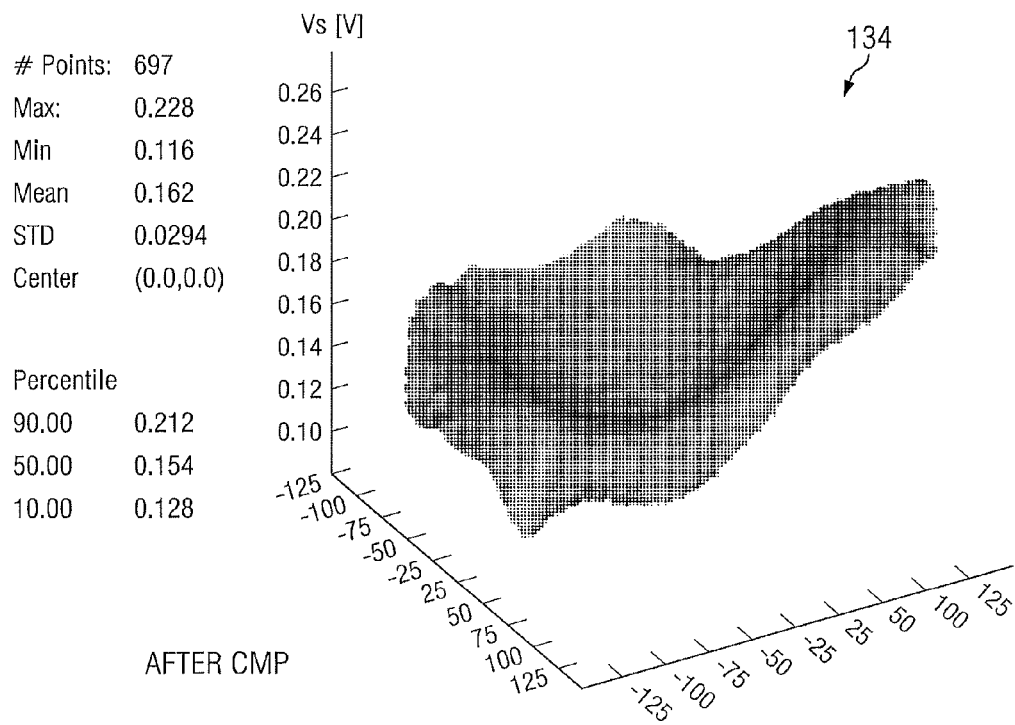
Figure 1J:
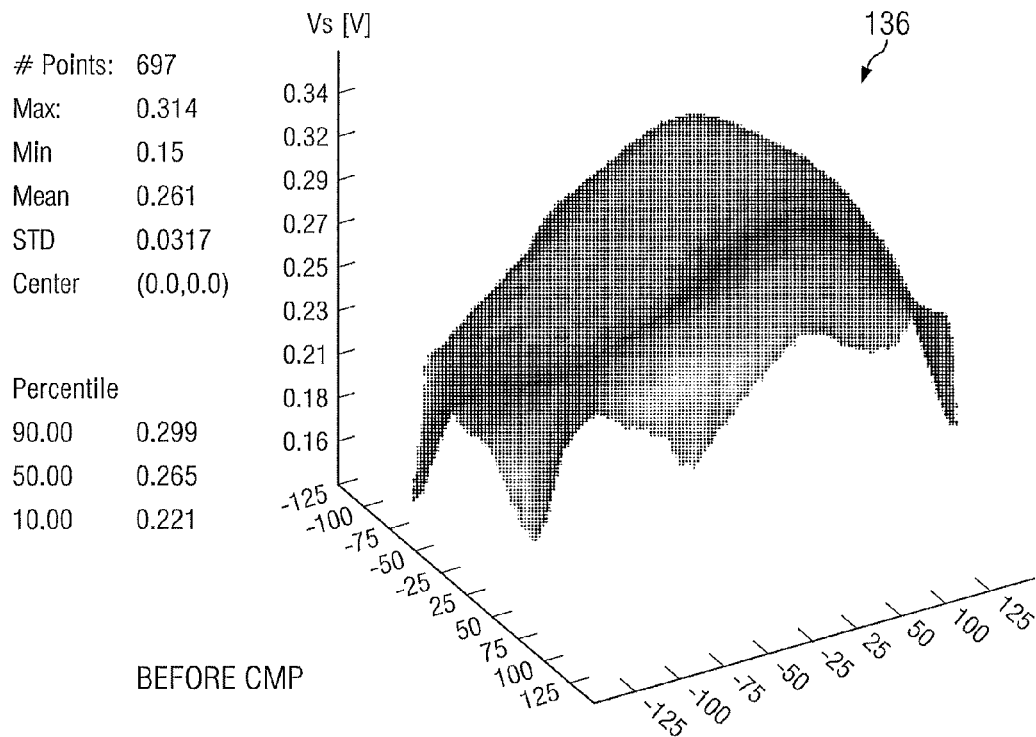
Figure 1J:
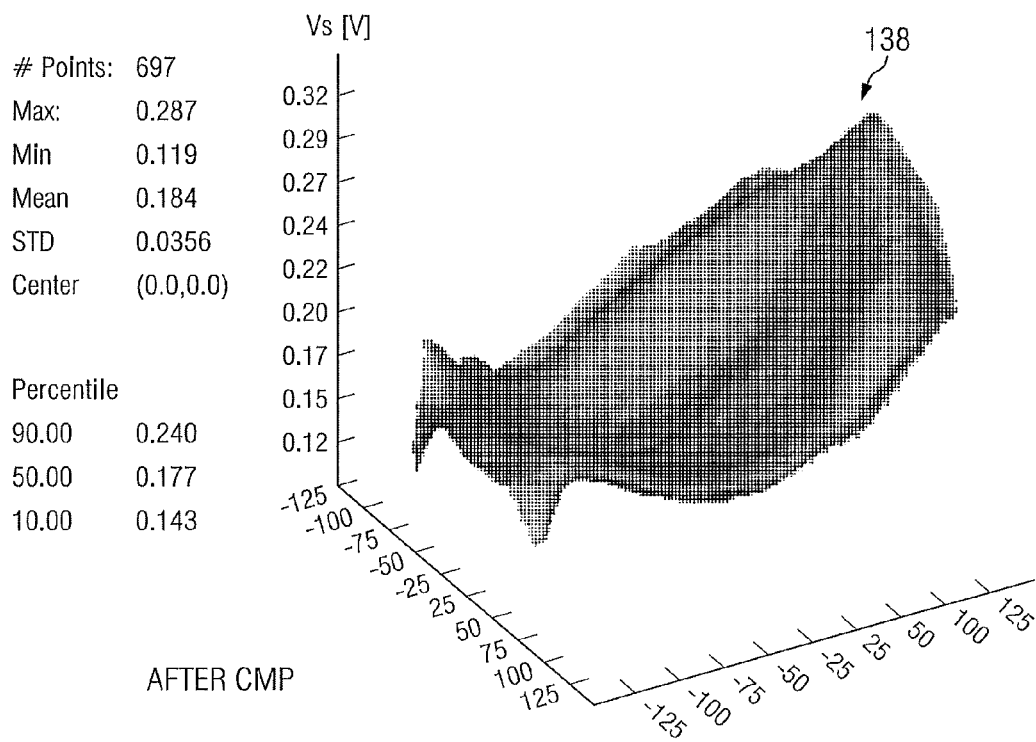
Figure 1K:
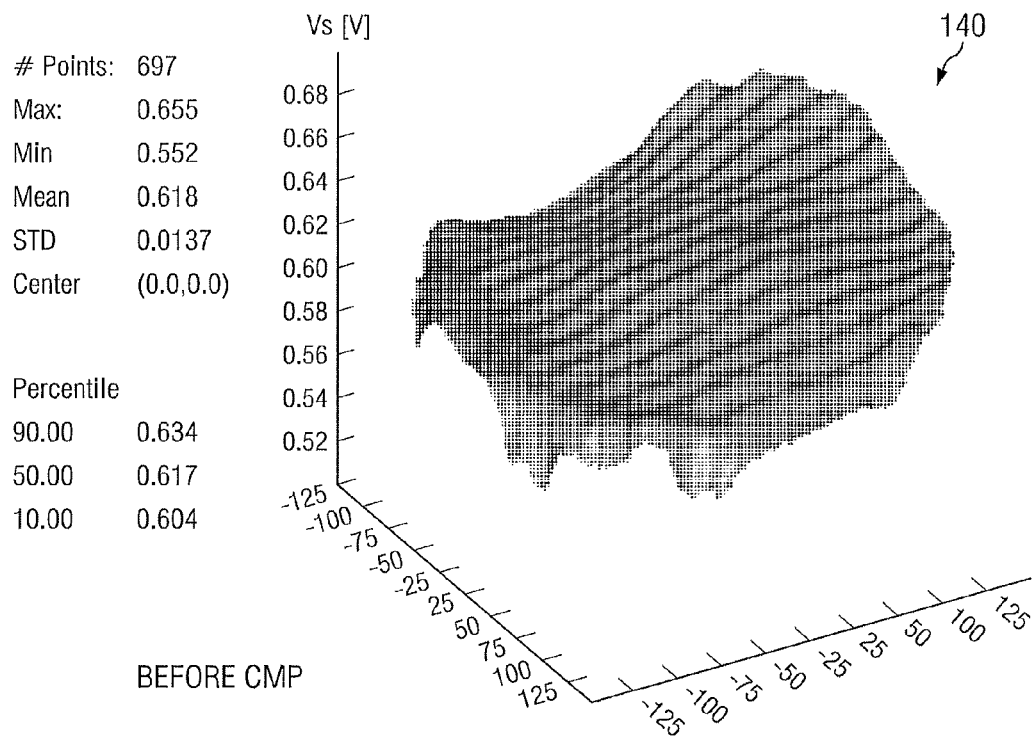
Figure 1K:
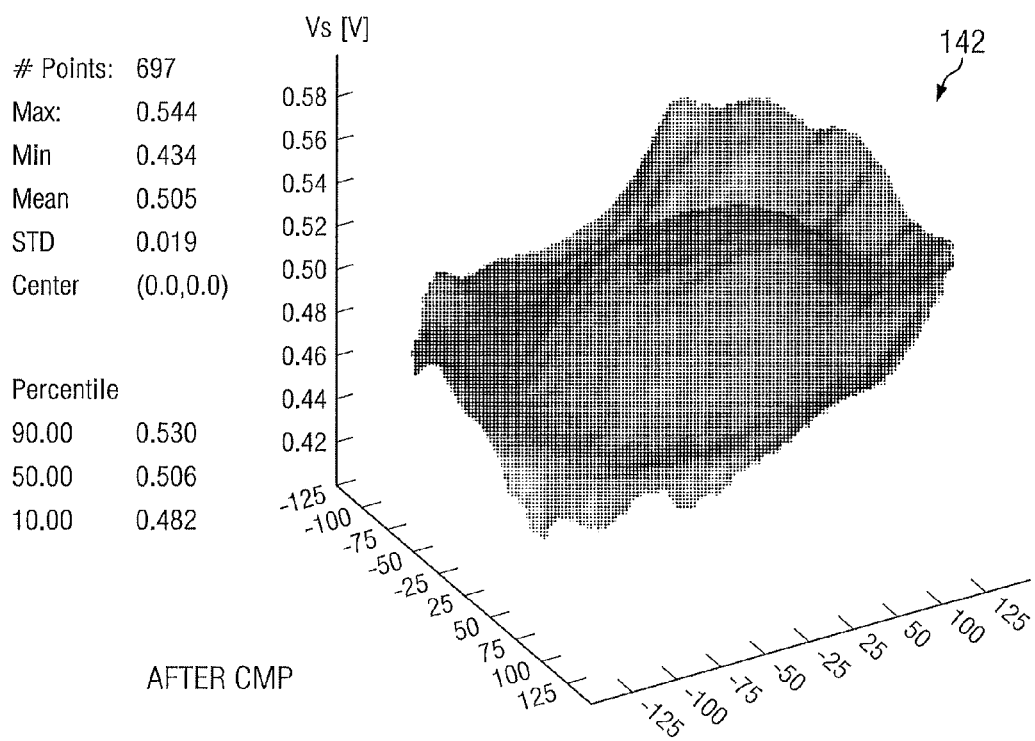
Figure 1L:
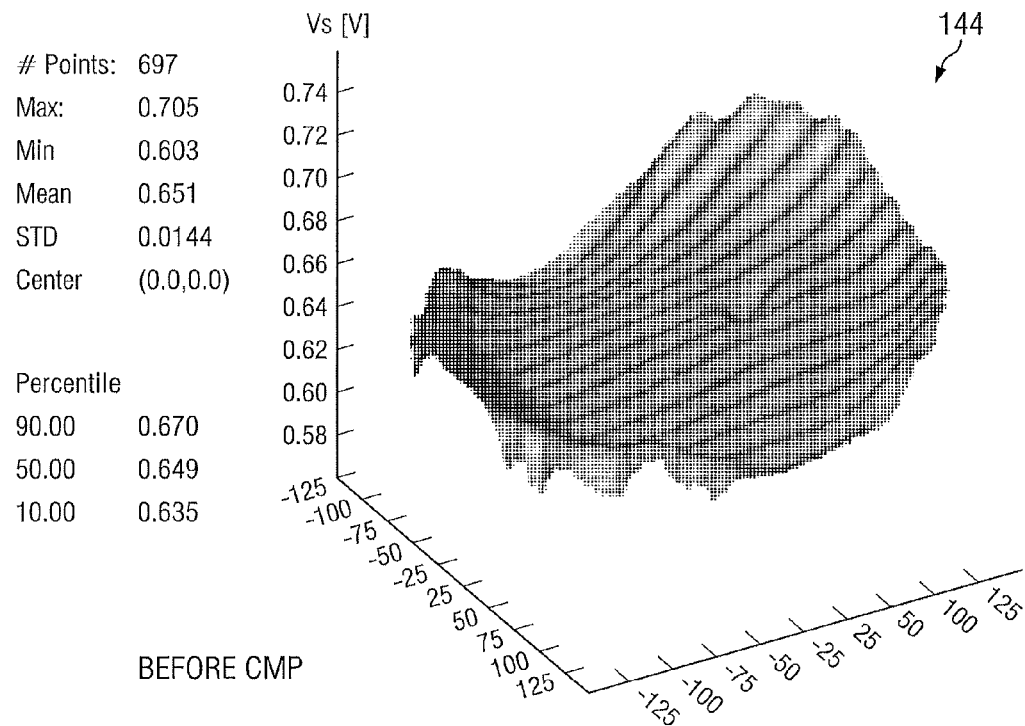
Figure 1L:
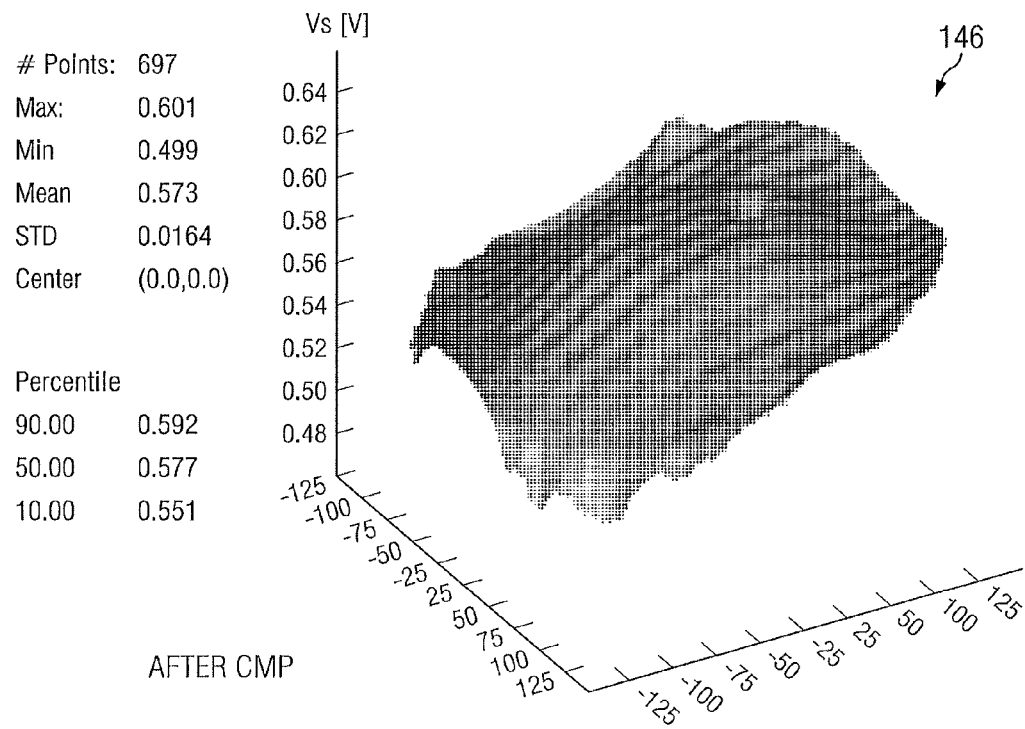
Figure 1M:
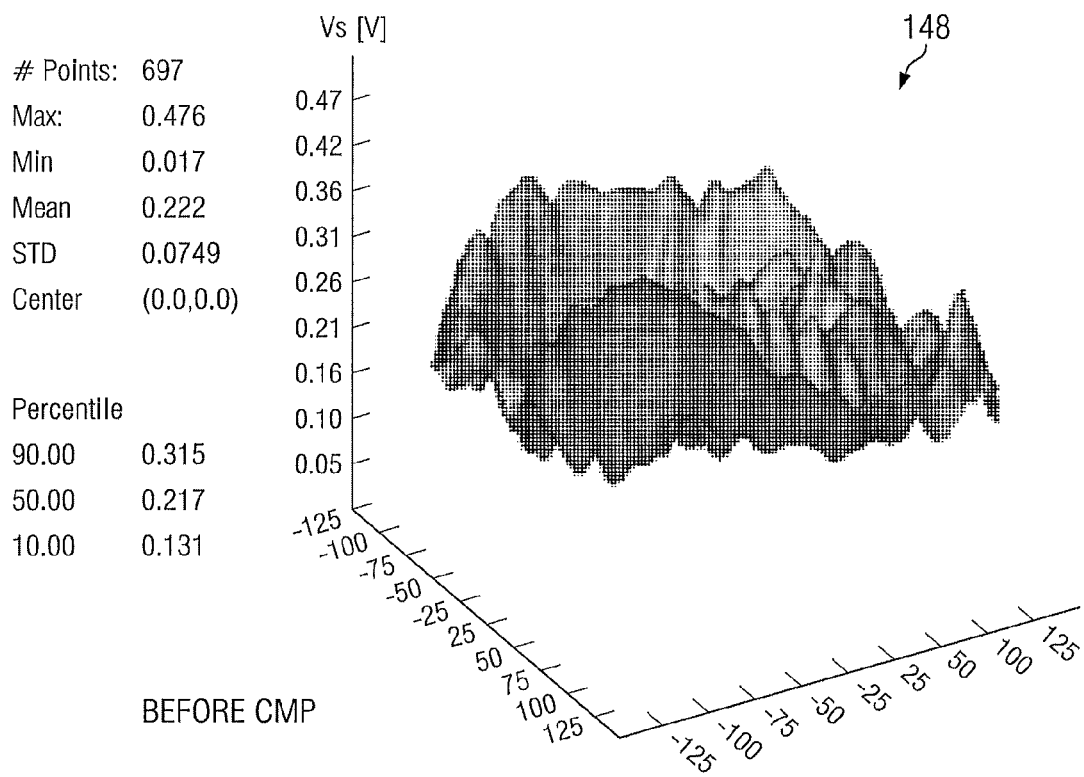
Figure 1M:
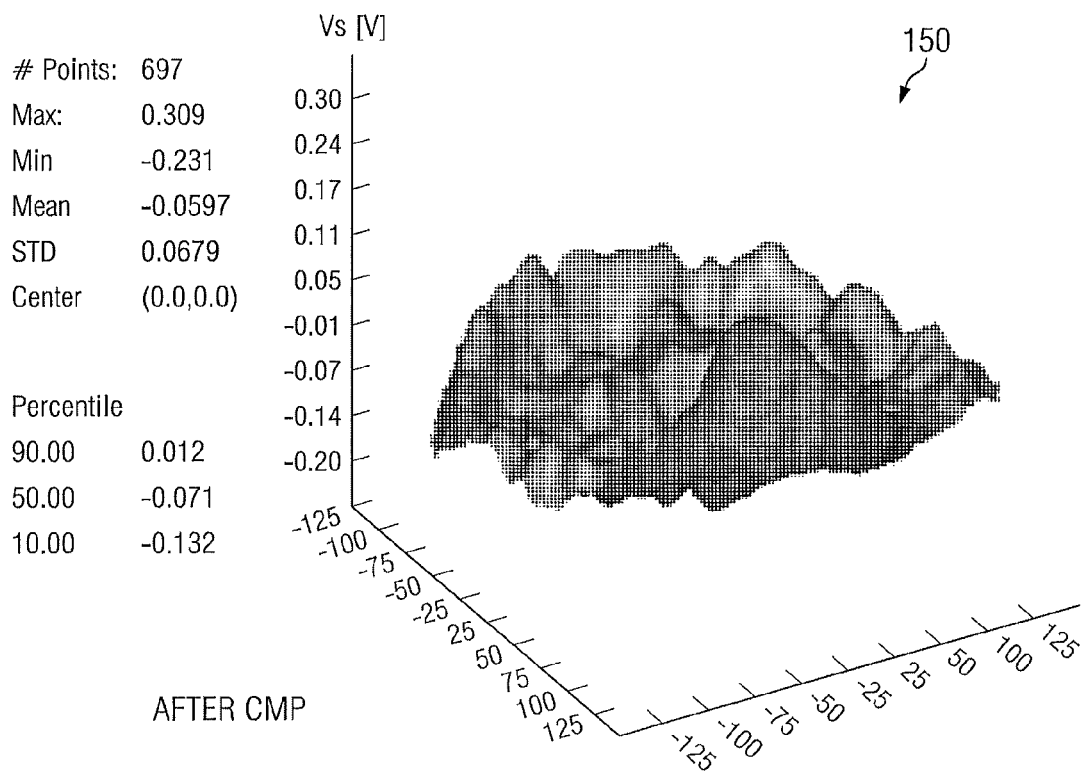
Figure 1N:
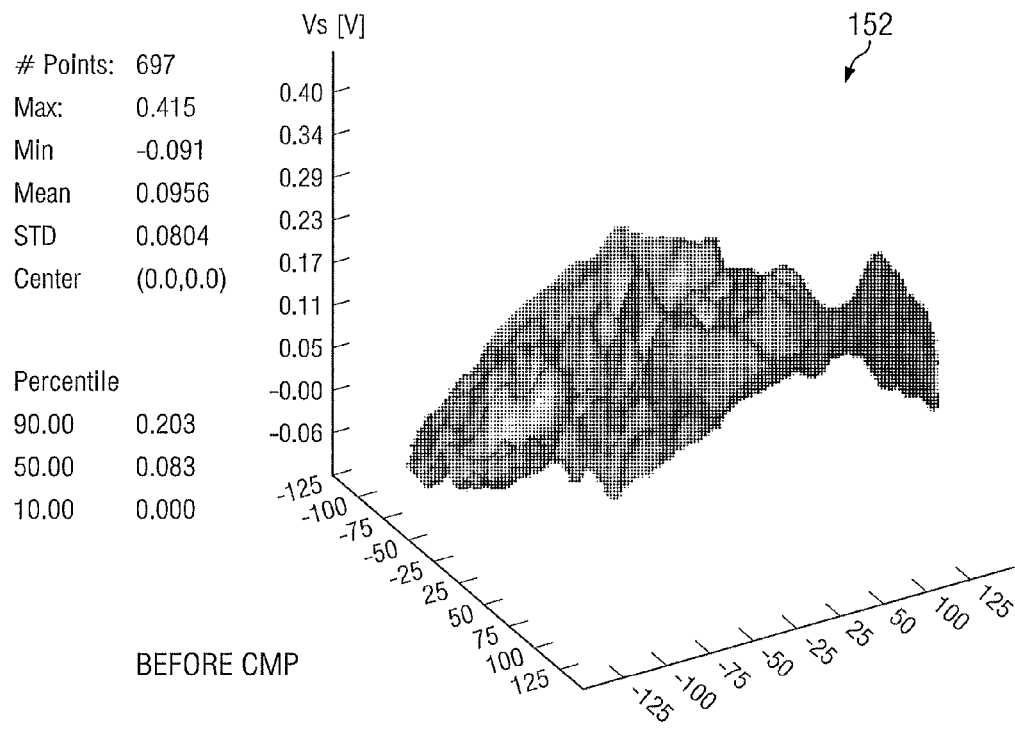
Figure 1N:
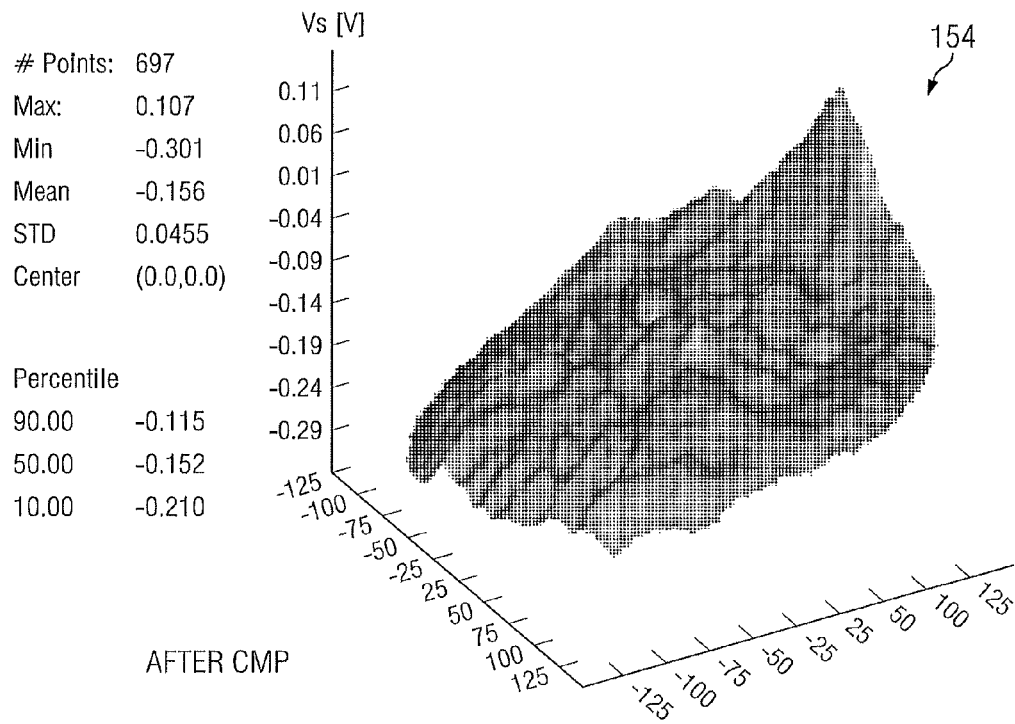
Figure 10:
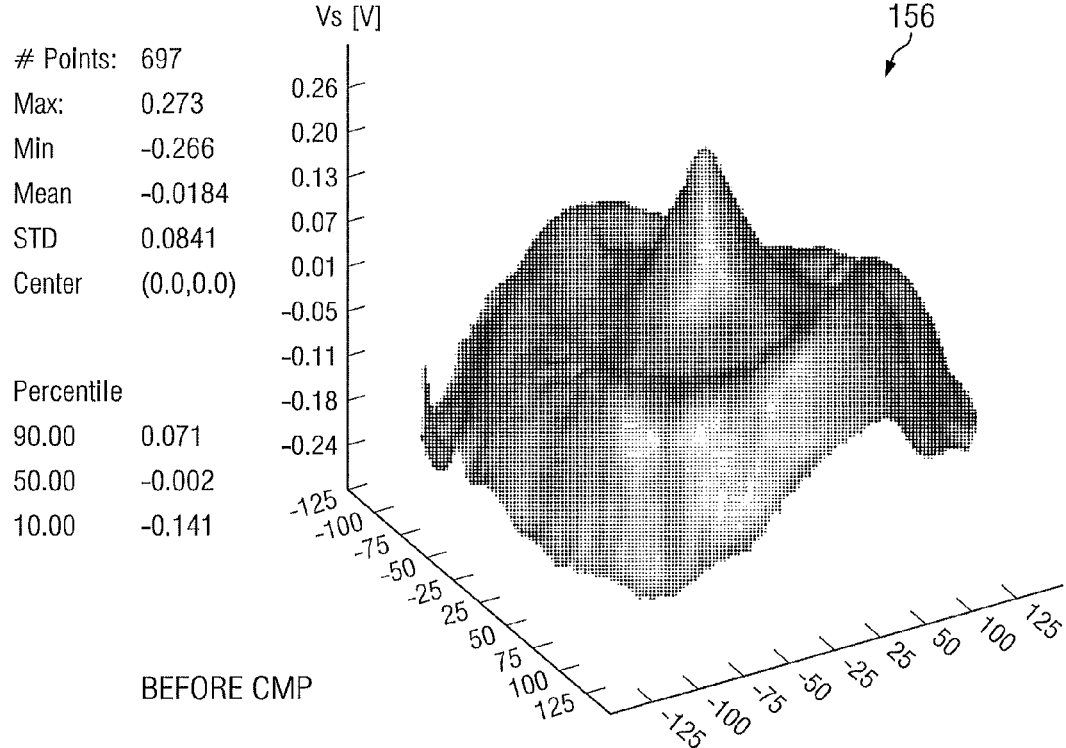
Figure 10:
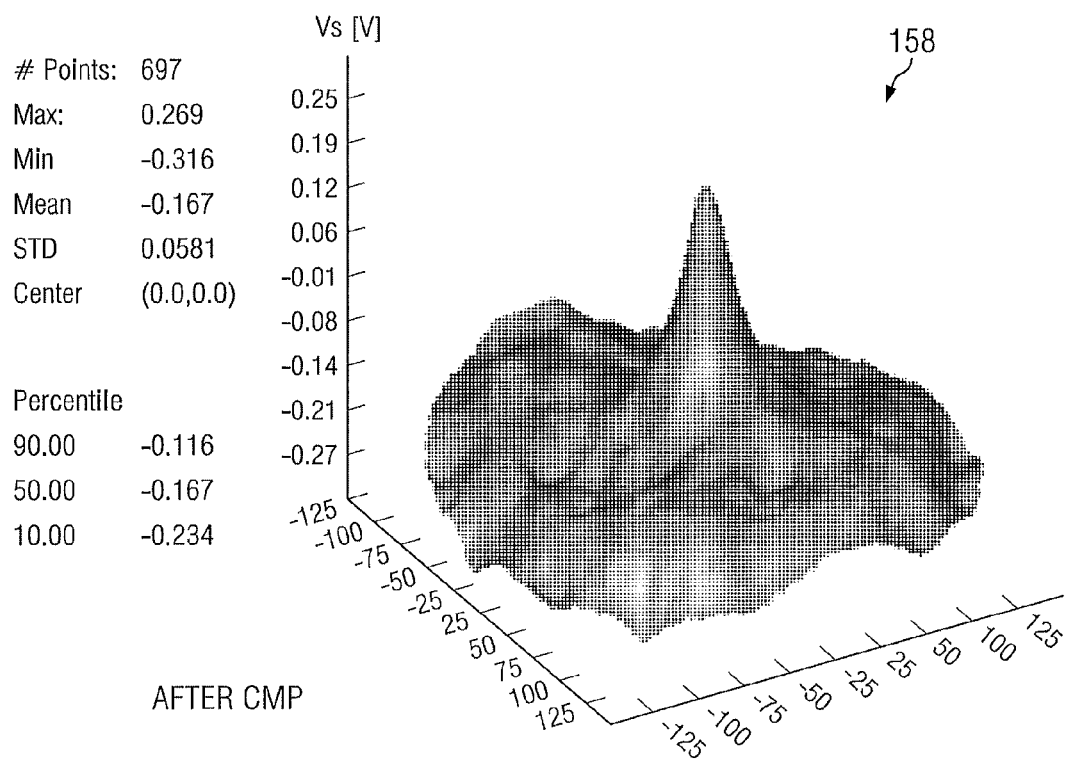
Figure 1P:
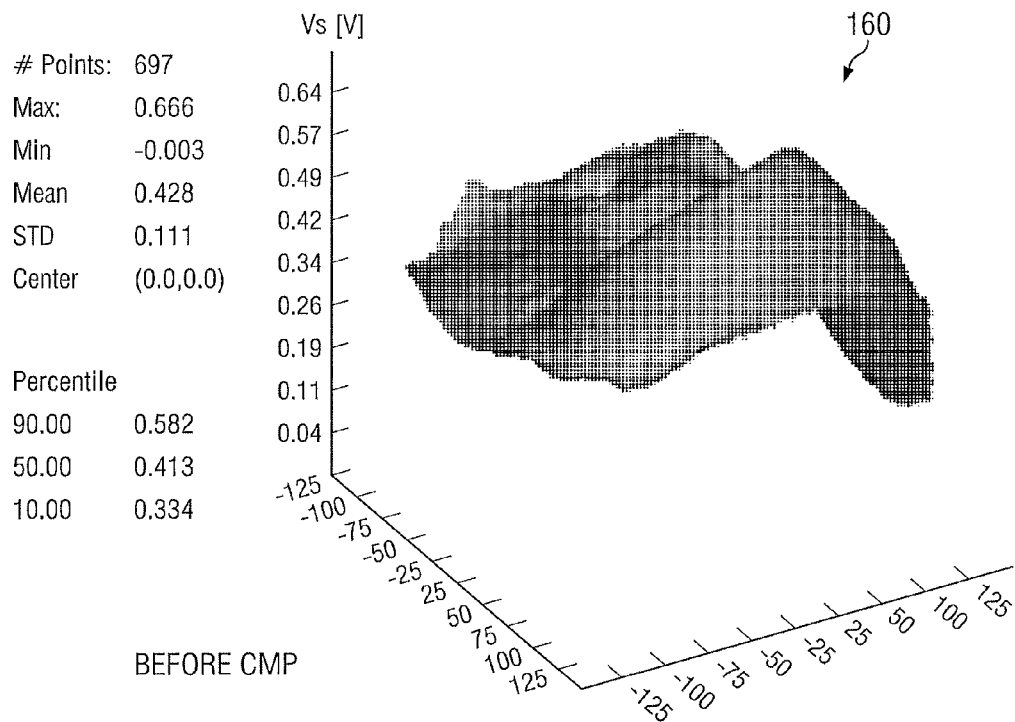
Figure 1P:
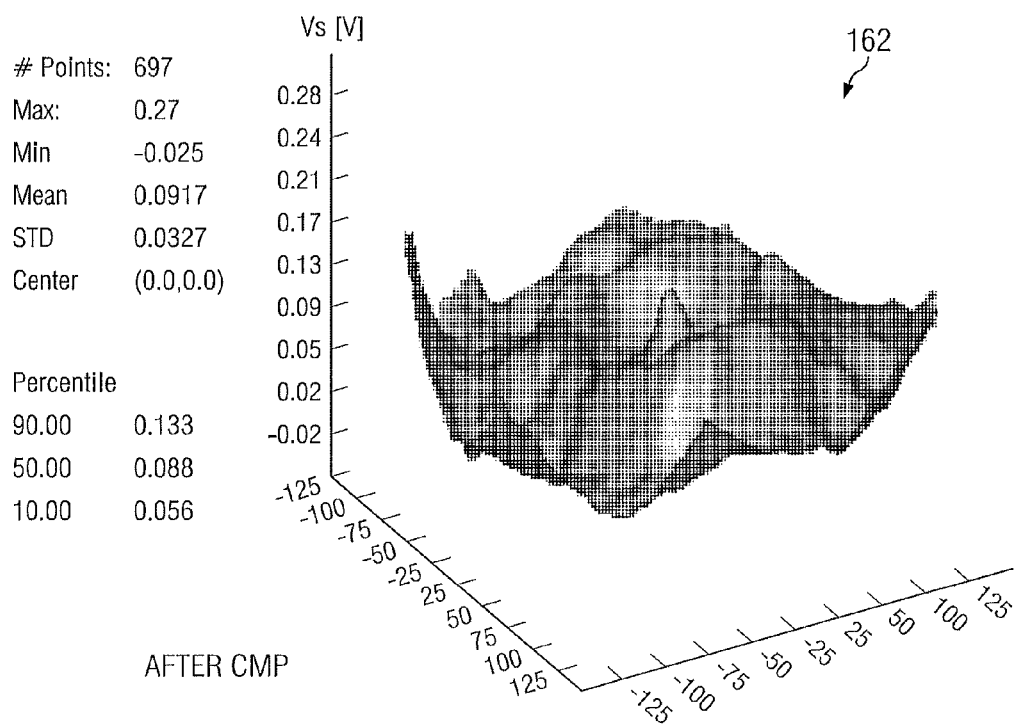

FIGS. 1A through 1P illustrate surface charges before and after CMP according to this disclosure. Each of FIGS. 1A through 1P illustrates surface charging before and after the CMP process for various metal and insulator films.

For example, FIG. 1A illustrates a Tantalum Nitride (TaN) film surface charge before 100 and after 102 a Platen 2 (P2) CMP. The surface charge varies from 0.07 before CMP to −0.02 after CMP.

FIG. 1B illustrates a TaN film surface charge before 104 and after 106 a Platen 3 (P3) CMP. The surface charge varies from −0.12 before CMP to −0.16 after CMP.

FIG. 1C illustrates a Copper (Cu) Seed film surface charge before 108 and after 110 a P2 CMP. The surface charge varies from −0.40 before CMP to −0.44 after CMP.

FIG. 1D illustrates a Cu Seed film surface charge before 112 and after 114 the P3 CMP. The surface charge varies from −0.36 before CMP to −0.44 after CMP.

FIG. 1E illustrates a Cu Plate film surface charge before 116 and after 118 the P2 CMP. The surface charge varies from −0.32 before CMP to −0.39 after CMP.

FIG. 1F illustrates a Cu Plate film surface charge before 120 and after 122 the P3 CMP. The surface charge varies from −0.32 before CMP to −0.39 after CMP.

FIG. 1G illustrates an octomethylcyclotetra-cyloxane (OMCATS) (e.g., a lower K insulated material) CAP film surface charge before 124 and after 126 the P2 CMP. The surface charge varies from 0.74 before CMP to 0.53 after CMP.

FIG. 1H illustrates an OMCATS CAP film surface charge before 128 and after 130 the P3 CMP. The surface charge varies from 0.70 before CMP to 0.52 after CMP.

FIG. 1I illustrates a Tetraethyl orthosilicate (TEOS) film surface charge before 132 and after 134 the P2 CMP. The surface charge varies from 0.30 before CMP to 0.26 after CMP.

FIG. 1J illustrates a TEOS film surface charge before 136 and after 138 the P3 CMP. The surface charge varies from 0.34 before CMP to 0.32 after CMP.

FIG. 1K illustrates a Low Temp Oxidation (LTO) film surface charge before 140 and after 142 the P2 CMP. The surface charge varies from 0.38 before CMP to 0.58 after CMP.

FIG. 1L illustrates an LTO film surface charge before 144 and after 146 the P3 CMP. The surface charge varies from 0.74 before CMP to 0.64 after CMP.

FIG. 1M illustrates an OMCATS Inverse Lithography Technology (ILT) film surface charge before 148 and after 150 the P2 CMP. The surface charge varies from 0.47 before CMP to 0.30 after CMP.

FIG. 1N illustrates an OMCATS ILT film surface charge before 152 and after 154 the P3 CMP. The surface charge varies from 0.40 before CMP to 0.11 after CMP.

FIG. 1-O illustrates a ULK film surface charge before 156 and after 158 the P2 CMP. The surface charge varies from 0.26 before CMP to 0.25 after CMP.

FIG. 1P illustrates a ULK film surface charge before 160 and after 162 the P3 CMP. The surface charge varies from 0.64 before CMP to 0.28 after CMP.

As shown in FIGS. 1A through 1P, the film surfaces exhibit memory effects, especially for the charge peak region where charging is most likely to occur. Ionizing of the surface can effectively smooth the charge peak areas and inhibit charging to occur.

Figure 2:
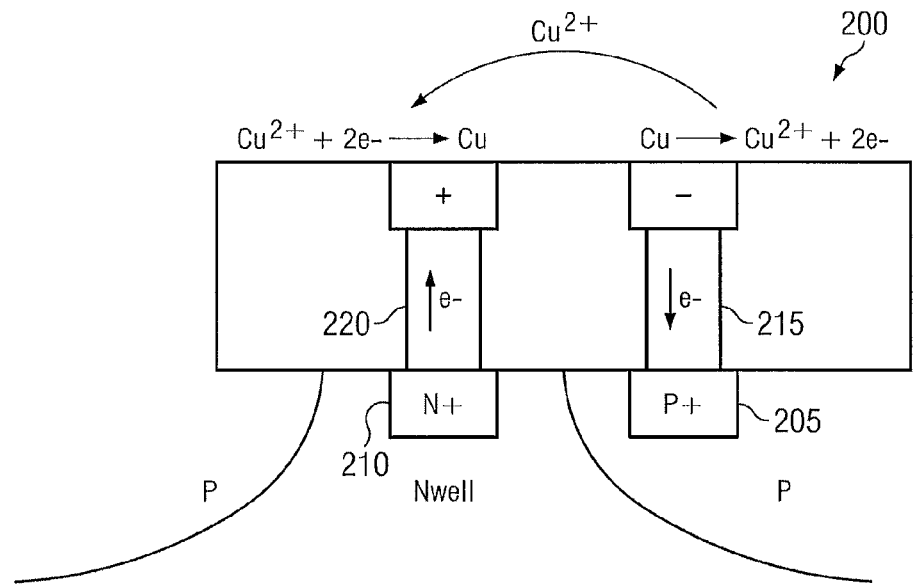
FIG. 2 illustrates an integration wafer according to the present disclosure.

FIG. 2 illustrates an integration wafer 200 according to the present disclosure. The integrated wafer 200 includes a P+ region 205 and an N+ region 210. The wet-chemical surface creates a galvanic cell where copper lines 215 on the P+ region 205 behave as an anode and copper lines 220 on the N+ region 210 behave as a cathode. As a result, a surface charge of Cu ions can be easily formed. Dendrite defects can be generated in critical and reproducible conditions.

Figure 3:
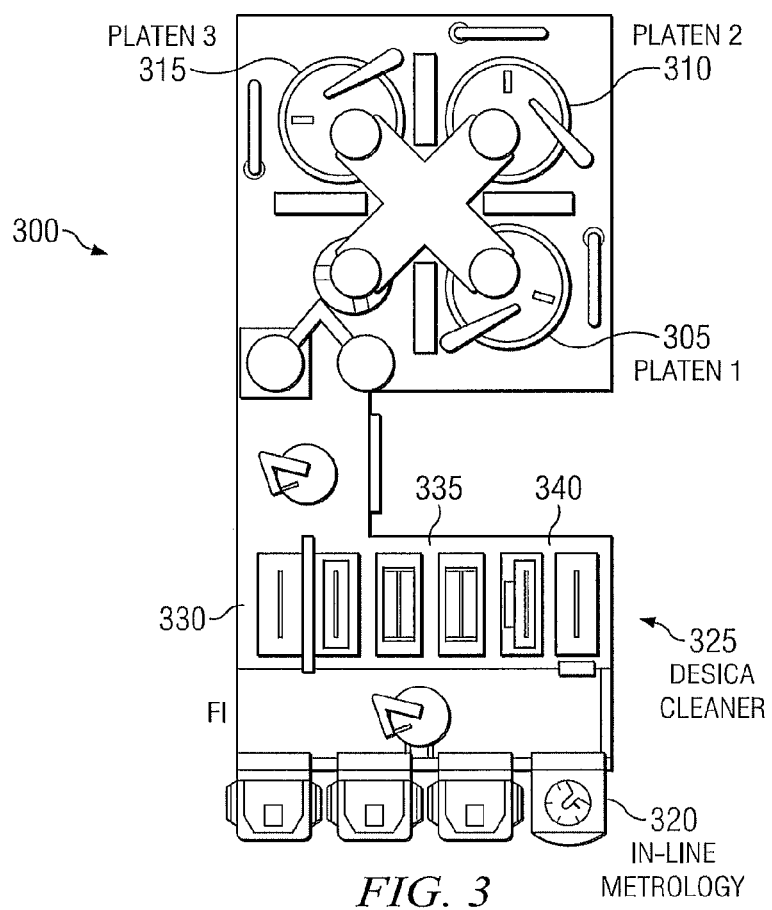
FIG. 3 illustrates a CMP system according to the present disclosure.

FIG. 3 illustrates a CMP system 300 according to the present disclosure. The embodiment of the CMP system 300 shown in FIG. 3 is for illustration only. Other CMP system embodiments could be used without departing from the scope of this disclosure.

The CMP system 300 includes three Platens, Platen 1 (P1) 305, Platen 2 (P2) 310 and Platen 3 (P3) 315. An inline metrology device 320 measures the surface characteristics of a wafer. Then, the wafer is processed through P1 305, P2 310 and P3 315. For example, P1 305 can be set for bulk (that is, full) Cu polish. P2 310 can be set as a copper clearing pattern, that is, to clear the copper. P3 315 can be configured for barrier clear and dielectric stopping. After the CMP processes, the wafer can be dried in a post CMP cleaner 325, such as a Desica®. The post CMP cleaner 325 can include a megasonic (Meg) cleaner stage 330, a dual brush clean stage 335 (such as brush 1 and brush 2 clean stages), and a dryer stage 340.

Figure 4:
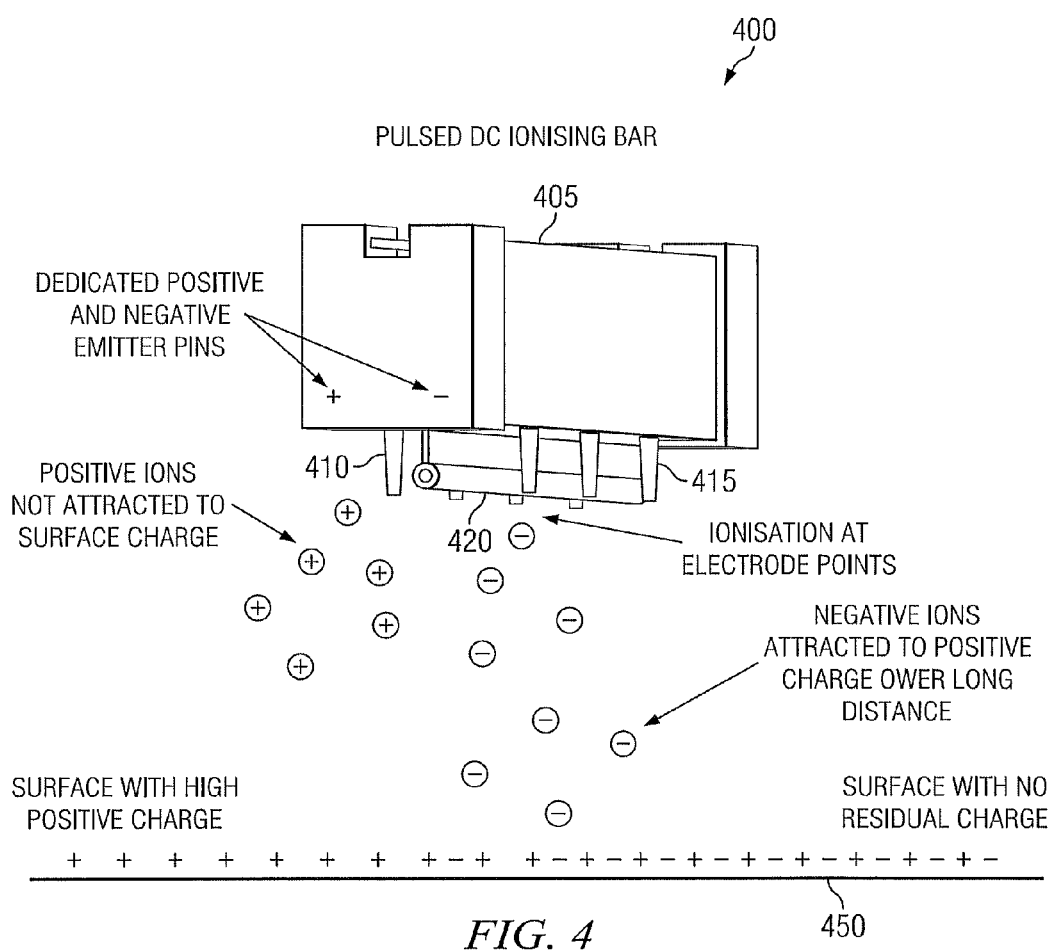
FIG. 4 illustrates a pulsed DC ionizing bar according to embodiments of the present disclosure.

FIG. 4 illustrates a pulsed DC ionizing bar 400 according to embodiments of the present disclosure. The embodiment of the pulsed DC ionizing bar 400 shown in FIG. 4 is for illustration only. Other embodiments could be used without departing from the scope of this disclosure.

The pulsed DC ionizing bar 400 includes a charge core 405. The pulsed DC ionizing bar 400 also includes a plurality of dedicated positive emitter pins 410 and a plurality of dedicated negative emitter pins 415. The plurality of dedicated positive emitter pins 410 and plurality of dedicated negative emitter pins 415 can be separated by an insulated separator 420. The separator 410 is configured to inhibit the flow of ions from the between the positive emitter pins 410 and negative emitter pins 415.

The pulsed DC ionizing bar 400 produces positive and negative ions. The ions are ejected onto the wafer surface 450 when the wafer passes through an ejection way in a charge neutralization zone. The ejection way is the area in the charge neutralization zone wherein the wafer is placed for charge neutralization processing by the pulsed DC ionizing bar 400 (discussed below with respect to FIG. 5). The positive ions are ejected though the plurality of positive emitter pins 410 and the negative ions are ejected through the plurality of negative emitter pins 415.

When the wafer surface 450 is positively charged, the positive ions ejected from the positive emitter pins 410 will not attach to the wafer surface 450 due to electrical repulsion. However, the negative ions ejected from the negative emitter pins 415 will attach to the wafer surface 450 as a result of the electrical attractive force. The attaching of the negative ions to the positively charged wafer surface 450 neutralizes the wafer surface 450. Any remaining neutralized residuals can be washed away during a normal wet clean procedure.

Additionally, when the wafer surface 450 is negatively charged, the negative ions ejected from the positive emitter pins 415 will not attach to the wafer surface 450 due to electrical repulsion. However, the positive ions ejected from the positive emitter pins 410 will attach to the wafer surface 450 as a result of the electrical attractive force. The attaching of the positive ions to the negatively charged wafer surface 450 also neutralizes the wafer surface 450. Any remaining neutralized residuals can be washed away during a normal wet clean procedure.

In some embodiments, the ion ratios from the pulsed DC ionizing bar 400 can be adjusted to vary the charge on the wafer surface charge. For example, the wafer surface charging can be changed to neutral, negative or positive by adjusting the positive to negative ion ratios that are ejected from the pulsed DC ionizing bar 400.

Figure 5:
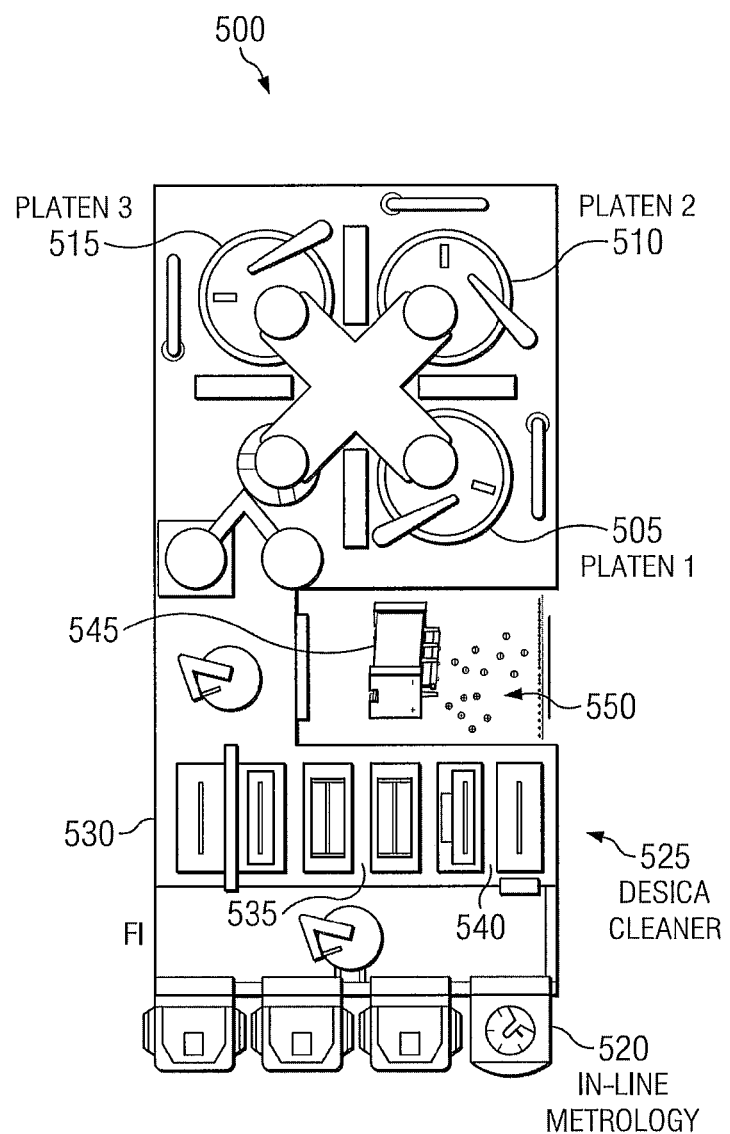
FIG. 5 illustrates a CMP system including a charge neutralizer according to embodiments of the present disclosure.
Figure 6:
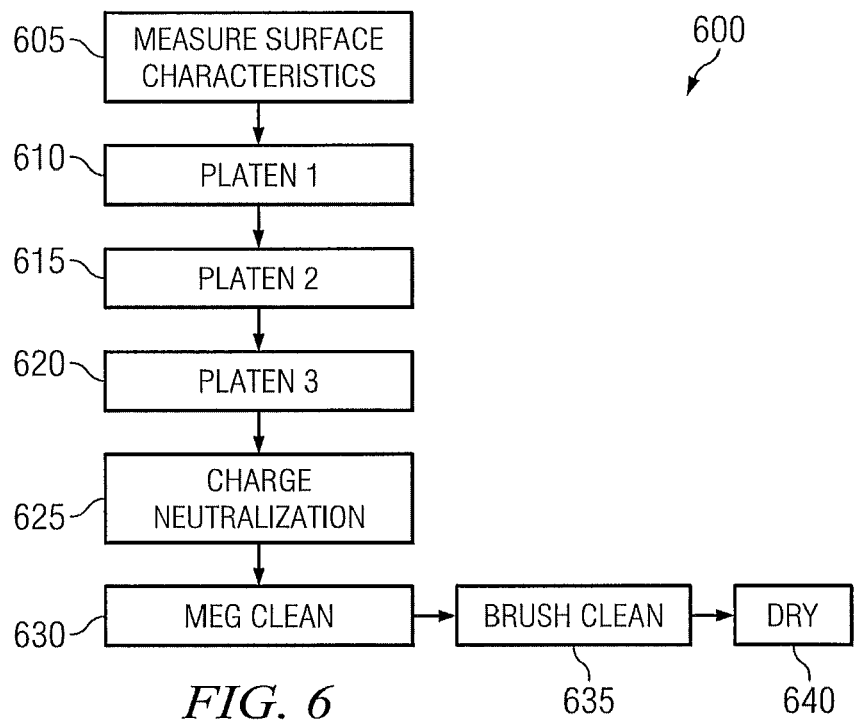
FIGS. 6 through 9 illustrate processes for charge neutralization according to embodiments of the present disclosure.

FIG. 5 illustrates a CMP system including a charge neutralizer according to embodiments of the present disclosure. The embodiment of the CMP system 500 shown in FIG. 5 is for illustration only. Other embodiments of the CMP system 500 could be used without departing from the scope of this disclosure.

The CMP system 500 includes three Platens, Platen 1 (P1) 505, Platen 2 (P2) 510 and Platen 3 (P3) 515. An inline metrology device 520 measures the surface characteristics of a wafer. The CMP system 500 includes a cleaning/drying stage, such as a Desica cleaner 525. The Desica cleaner 525 can include a metrosonic (Meg) cleaner stage 530, a brush clean stage 535 (such as brush 1 and brush 2 clean stages), and a dryer stage 540. In addition, the CMP system 500 includes a charged neutralizer 545. The charge neutralizer can be any ionizing source, such as a pulsed DC ionizing bar 400. The charged neutralizer 545 is disposed in a charge neutralizing zone 550.

The charge neutralizing zone 550 can be disposed within the CMP system 500 in relationship to the platens 505-515 and Desica cleaner 525. For example, the charge neutralizing zone 550 can be disposed between the platens 505-515 and Desica cleaner 525 such that charge neutralization can occur prior to or after the CMP process. In some embodiments, the charged neutralizer 545 can be disposed prior to the Meg clean stage 530. In some embodiments, the charged neutralizer 545 can be disposed prior to the brush clean stage 535. In some embodiments, the charged neutralizer 545 can be disposed prior to the dryer stage 540.

The wafer is processed through one or more wafer processing stations, such as P1 505, P2 510 and P3 515. For example, P1 505 can be set for bulk (that is, full) Cu polish. P2 510 can be set as a copper clearing pattern, that is, to clear the copper. P3 515 can be configured for barrier clear and dielectric stopping. After the CMP processes, the wafer can be dried in a Desica cleaner 525. After the CMP processing, the wafer undergoes charge neutralization. The wafer is placed in the ejection way of the charged neutralizer 545 prior to or during the cleaning/drying stage. For example, the wafer can be placed in the ejection way of the charge neutralizer prior to being placed in the Meg clean stage 530, or prior to being placed the brush clean stage 535, or prior to being placed the dryer stage 540, or any combination thereof.

In additional and alternative embodiments, the charged neutralizer 545 can be disposed such that charge neutralization is performed after measurement by the inline metrology 520. Then, the wafer is processed through P1 505, P2 510 and P3 515. For example, P1 505 can be set for bulk (that is, full) Cu polish. P2 510 can be set as a copper clearing pattern, that is, to clear the copper. P3 515 can be configured for barrier clear and dielectric stopping. After the CMP processes, the wafer can be dried in a Desica cleaner 525 The Desica cleaner 525 can include a metrosonic cleaner stage 530, a brush clean stage 535 (such as brush 1 and brush 2 clean stages), and a dryer stage 540. In some embodiments, the wafer undergoes a second charge neutralization after CMP processing. For example, the wafer can be placed in the ejection way of the charged neutralizer 545 prior to being placed in the Meg clean stage 530. In some embodiments, the wafer can be placed in the ejection way of the charged neutralizer 545 prior to being placed the brush clean stage 535. In some embodiments, the wafer can be placed in the ejection way of the charged neutralizer 545 prior to being placed the dryer stage 540.

FIGS. 6 through 9 illustrate processes for charge neutralization according to embodiments of the present disclosure. The embodiment of processes 600, 700, 800 and 900 shown in FIGS. 6-9 are for illustration only. Other embodiments could be used without departing from the scope of this disclosure.

In block 605, the surface characteristics of a wafer are measured. The surface characteristics can be measured by an inline metrology device. Thereafter, the wafer can undergo CMP processing. For example, in block 610, a first Platen (P1) can be set for bulk (that is, full) Cu polish. In block 615, a second Platen (P2) can be set as a copper clearing pattern, that is, to clear the copper. In block 620, a third Platen (P3) can be configured for barrier clear and dielectric stopping. Thereafter, the wafer undergoes charge neutralization in block 625. Charge neutralization can be performed by any ionizing source, such as the pulsed DC ionizing bar 400. The wafer then undergoes a cleaning, such as a metrosonic cleaning, in block 630. In block 635, a brush cleaning is applied to a wafer. Thereafter, in block 640, the wafer undergoes a drying stage.

Figure 7:
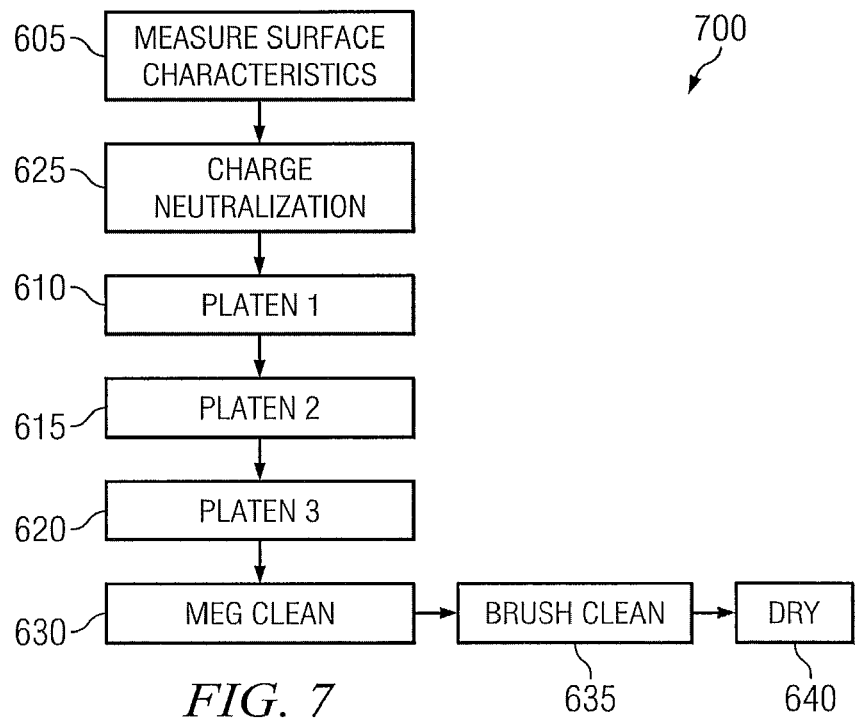

In the example shown in FIG. 7, the charge neutralization in block 625 is performed before the CMP process, that is, before the first Platen in block 610. For example, in block 605, the surface characteristics of a wafer are measured. The surface characteristics can be measured by an inline metrology device. Then, the wafer is transferred to neutralizing station in which the wafer undergoes charge neutralization in block 625. Charge neutralization can be performed by any ionizing source, such as the pulsed DC ionizing bar 400. Thereafter, the wafer is transferred to one or more CMP processing stations. For example, the wafer can undergo CMP processing in block 610, in which a first Platen (P1) can be set for bulk (that is, full) Cu polish; in block 615, in which a second Platen (P2) can be set as a copper clearing pattern, that is, to clear the copper; and in block 620, in which a third Platen (P3) can be configured for barrier clear and dielectric stopping. Thereafter, the wafer undergoes a cleaning, such as a metrosonic cleaning, in block 630. In block 635, a brush cleaning is applied to a wafer. Then, in block 640, the wafer undergoes a drying stage.

Figure 8:
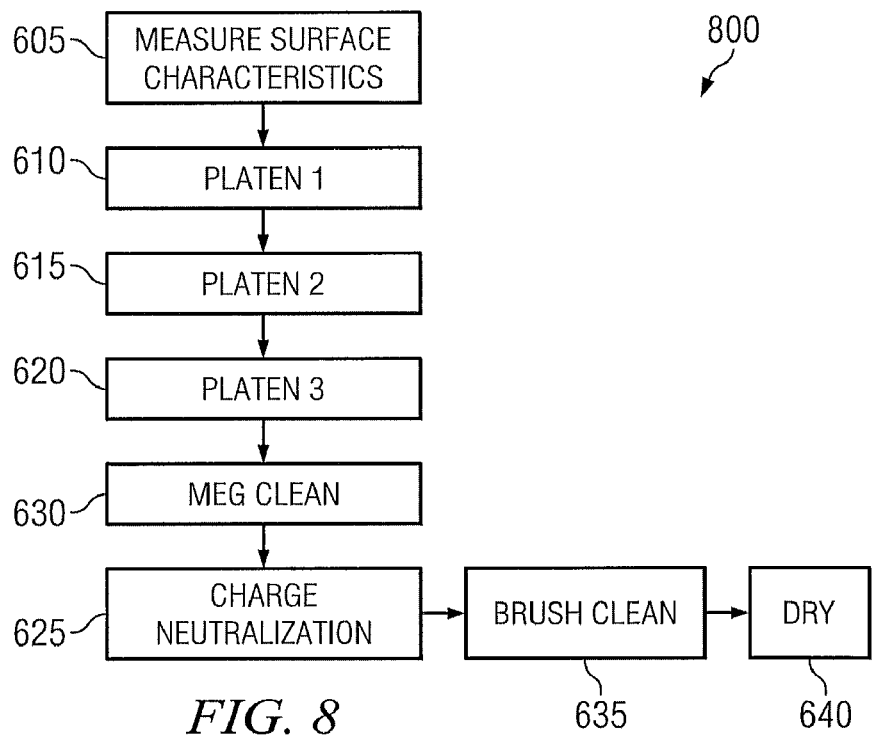

In the example shown in FIG. 8, the charge neutralization in block 625 is performed during the cleaning/drying stage after the metrosonic cleaning in block 630. For example, in block 605, the surface characteristics of a wafer are measured. The surface characteristics can be measured by an inline metrology device. Thereafter, the wafer can undergo CMP processing in block 610, in which a first Platen (P1) can be set for bulk (that is, full) Cu polish; in block 615, in which a second Platen (P2) can be set as a copper clearing pattern, that is, to clear the copper; and in block 620, in which a third Platen (P3) can be configured for barrier clear and dielectric stopping. Thereafter, the wafer undergoes a cleaning, such as a metrosonic cleaning, in block 630. Then, the wafer undergoes charge neutralization in block 625. Charge neutralization can be performed by any ionizing source, such as the pulsed DC ionizing bar 400. In block 635, a brush cleaning is applied to a wafer. Then, in block 640, the wafer undergoes a drying stage.

Figure 9:
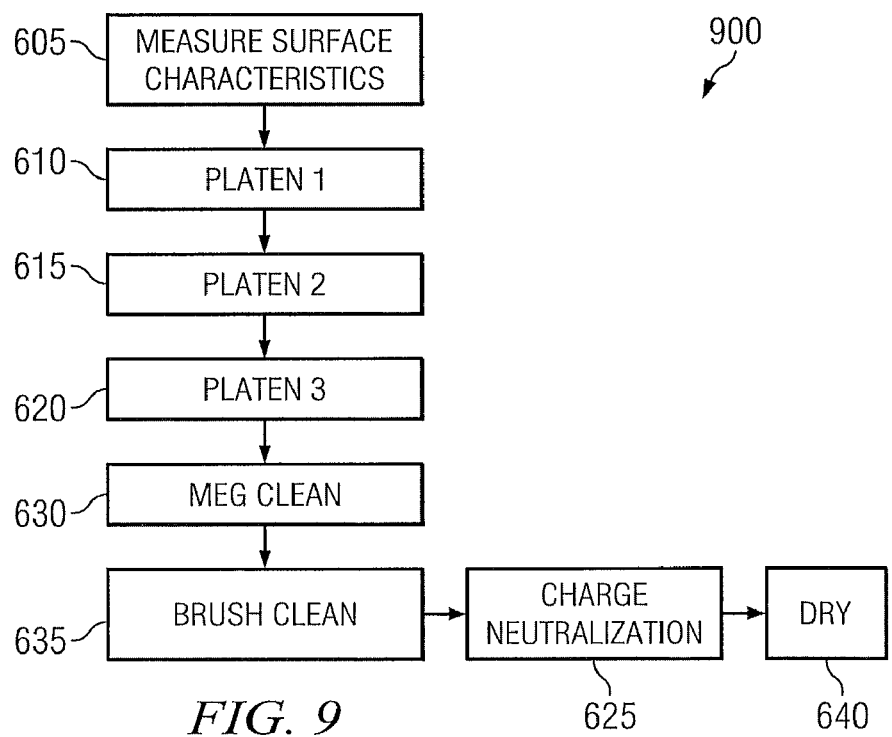

In the example shown in FIG. 9, the charge neutralization in block 625 is performed during the cleaning/drying stage after the brush stage in block 635. For example, in block 605, the surface characteristics of a wafer are measured. The surface characteristics can be measured by an inline metrology device. Thereafter, the wafer can undergo CMP processing in block 610, in which a first Platen (P1) can be set for bulk (that is, full) Cu polish; in block 615, in which a second Platen (P2) can be set as a copper clearing pattern, that is, to clear the copper; and in block 620, in which a third Platen (P3) can be configured for barrier clear and dielectric stopping. Thereafter, the wafer undergoes a cleaning, such as a metrosonic cleaning, in block 630. Then, the wafer undergoes charge neutralization in block 625. Charge neutralization can be performed by any ionizing source, such as the pulsed DC ionizing bar 400. In block 635, a brush cleaning is applied to a wafer. Then, in block 640, the wafer undergoes a drying stage.

Although FIGS. 6 through 9 illustrate examples of a charge neutralization process, various changes may be made to FIGS. 6 through 9. For example, one or more steps could be omitted, modified, or rearranged and additional steps could be added in FIGS. 6 through 9. In some embodiments, the charge neutralization in block 625 is performed more than once and can occur at different stages during the process. For example, block 625 can occur prior to block 610 and after block 620. Also, various modifications could be made to the structures shown in FIGS. 4 and 5. Further, while certain components have been described above as being formed from particular materials, each component could be formed from any suitable material(s) and in any suitable manner. In addition, the relative sizes and shapes of the components are for illustration only.

Embodiments of the present disclosure can be applied to all wet clean systems. In addition, embodiments of the present disclosure can be applied to all kinds of wafer surfaces that undergo wet cleaning such as metal and insulators. The wafer surfaces can undergo charge neutralization at anytime once the surface experiences charging issues. Further, dendrite defects can be reduced by a post CMP clean using base chemistry as opposed to acid chemistry. Embodiments of the present disclosure improve the production wafer yield through the elimination of the wafer surface charging and can be applied at any wet clean step. Further, embodiments of the present disclosure can enable the changing of the wafer surface charging to neutralization, negative and positive by adjusting the positive to negative ions ratios that are ejected from the ionization source.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A processing system capable of cleaning a surface of a semiconductor wafer, the system comprising:
    a wafer measuring device configured to measure characteristics of a surface of the semiconductor wafer;
    at least one wafer processing station configured to at least one of clean and polish the wafer surface; and
    a charge neutralizing device configured to alter a surface charge of the wafer surface, wherein the charge neutralizing device is disposed between the wafer measuring device and the at least one wafer processing station.

2. The wafer processing system of claim 1, wherein the charge neutralizing device includes a plurality of electrode points.

3. The wafer processing system of claim 1, wherein the charge neutralizing device is configured to receive the semiconductor wafer from the at least one processing station and transfer the semiconductor wafer to a cleaning/drying station.

4. The wafer processing system of claim 1, wherein the charge neutralizing device is configured to receive the semiconductor wafer from the measuring device and transfer the semiconductor wafer to the at least one processing station.

5. The wafer processing system of claim 1, wherein the charge neutralizing device comprises an ionizing source.

6. The wafer processing system of claim 5, wherein the ionizing source comprises a pulsed DC ionizing bar configured to vary an ion ratio ejected onto the wafer surface.

7. The wafer processing system of claim 1, wherein the charge neutralizing device is a cleaning/drying station that includes a megasonic cleaning stage and a brush cleaning stage, and wherein charge neutralizing device is configured to receive the wafer from at least one of: the megasonic cleaning stage and the brush cleaning stage.

8. The wafer processing system of claim 1, wherein neutralizing comprises varying a ratio between positive ions and negative ions ejected onto the wafer surface based on at least one of: a current charge characteristic of the wafer surface; and a desired charge characteristic of the wafer surface.

9. A Chemical Mechanical Polishing (CMP) system capable of cleaning a surface of a semiconductor wafer, the CMP system comprising:
    a wafer measuring device configured to measure characteristics of a surface of the semiconductor wafer;
    at least one wafer processing station configured to perform a CMP process on the wafer surface; a post CMP cleaning station configured to clean and dry the semiconductor wafer; and
    a charge neutralizing device configured to alter a surface charge of the wafer surface, wherein the charge neutralizing device is disposed between the wafer measuring device and the at least one wafer processing station.

10. The CMP system of claim 9, wherein the charge neutralizing device includes a plurality of electrode points.

11. The CMP system of claim 10, wherein the charge neutralizing device is configured to receive the semiconductor wafer from the at least one processing station and transfer the semiconductor wafer to the post CMP cleaning station.

12. The CMP system of claim 10, wherein the charge neutralizing device is configured to receive the semiconductor wafer from the measuring device and transfer the semiconductor wafer to the at least one processing station.

13. The CMP system of claim 9, wherein the charge neutralizing device comprises an ionizing source configured to vary an ion ratio ejected onto the wafer surface.

14. The CMP system of claim 13, wherein the ionizing source comprises a pulsed DC ionizing bar.

15. The CMP system of claim 9, wherein the post CMP cleaning station includes a metrosonic cleaning stage and a brush cleaning stage, and wherein the charge neutralizing device is included the desica cleaning station and configured to receive the wafer from at least one of: the metrosonic cleaning stage and the brush cleaning stage.

16. A method for cleaning a surface of a semiconductor wafer, the method comprising:
    measuring at least one characteristic of a surface of the semiconductor wafer;
    processing the wafer surface; and
    neutralizing a surface charge of the wafer surface using a charge neutralizing device disposed between a wafer measuring device measuring the at least one characteristic and at least one wafer processing station performing the processing.

17. The method of claim 16, wherein neutralizing further comprises receiving the semiconductor wafer from at least one processing station configured to process the wafer surface and transferring the semiconductor wafer to desica cleaning station.

18. The method of claim 16, wherein neutralizing is configured to at any time when a charge exists on the wafer surface.

19. The wafer processing system of claim 16, wherein neutralizing comprises at least one of: removing a charge prior to a chemical mechanical planarization (CMP) process; removing a charge produced by the CMP process; removing a charge after at least one stage in a cleaning/drying process; and stabilizing the wafer surface by changing the surface charge to be negatively charged.

20. The method of claim 16, wherein neutralizing comprises ejecting ions onto the wafer surface by an ionizing source.

* * * * *